(12) United States Patent
Hashimoto et al.

(10) Patent No.: US 10,705,385 B2
(45) Date of Patent: Jul. 7, 2020

(54) OPTICAL LAMINATE, CIRCULARLY POLARIZING PLATE, TOUCH PANEL, AND IMAGE DISPLAY DEVICE

(71) Applicant: ZEON CORPORATION, Chiyoda-ku, Tokyo (JP)

(72) Inventors: Hiromasa Hashimoto, Tokyo (JP); Masakazu Saito, Tokyo (JP)

(73) Assignee: ZEON CORPORATION, Chiyoda-ku, Tokyo (JP)

( * ) Notice: Subject to any disclaimer, the term of this patent is extended or adjusted under 35 U.S.C. 154(b) by 0 days.

(21) Appl. No.: 16/464,764

(22) PCT Filed: Nov. 28, 2017

(86) PCT No.: PCT/JP2017/042583
§ 371 (c)(1),
(2) Date: May 29, 2019

(87) PCT Pub. No.: WO2018/101250
PCT Pub. Date: Jun. 7, 2018

(65) Prior Publication Data
US 2019/0391433 A1 Dec. 26, 2019

(30) Foreign Application Priority Data
Nov. 30, 2016 (JP) .................. 2016-233267

(51) Int. Cl.
*G02F 1/13363* (2006.01)
*G02B 5/30* (2006.01)
(Continued)

(52) U.S. Cl.
CPC ....... *G02F 1/13363* (2013.01); *G02B 5/3083* (2013.01); *G02F 1/133528* (2013.01);
(Continued)

(58) Field of Classification Search
CPC ........... G02F 1/13363; G02F 1/133528; G02B 5/3083; G06F 3/044; G09F 9/30; H01L 27/32; H01L 51/50
See application file for complete search history.

(56) References Cited

U.S. PATENT DOCUMENTS

| 5,296,519 A | 3/1994 | Otsuka |
| 5,401,438 A | 3/1995 | Otsuka |
(Continued)

FOREIGN PATENT DOCUMENTS

| JP | H01204092 A | 8/1989 |
| JP | H03174512 A | 7/1991 |
(Continued)

OTHER PUBLICATIONS

C.Destrade et al., Disc-Like Mesogens: A Classification, Molecular Crystals and Liquid Crystals, 1981, pp. 111-135, vol. 71, Issue 1-2.
(Continued)

*Primary Examiner* — Sardis F Azongha
(74) *Attorney, Agent, or Firm* — Kenja IP Law PC

(57) ABSTRACT

An optical layered body including a substrate layer, and an optically anisotropic layer containing at least one liquid crystal cured layer, wherein a light transmittance of the substrate layer at a wavelength of 390 nm is 1% or less, and an in-plane retardation Re0(450) at a wavelength 450 nm before the optical layered body is exposed to the xenon lamp, an in-plane retardation Re0(550) at a wavelength 550 nm before the optical layered body is exposed to the xenon lamp, an in-plane retardation Re300(450) at the wavelength 450 nm after the optical layered body was exposed to the xenon lamp for 300 hours, and an in-plane retardation Re300(550) at the wavelength 550 nm after the optical layered body was exposed to the xenon lamp for 300 hours satisfy the following formulae (1) and (2):
(Continued)

$$0.95 \leq Re300(450)/Re0(450) \leq 1.05 \quad (1),$$

$$0.95 \leq Re300(550)/Re0(550) \leq 1.05 \quad (2).$$

13 Claims, 2 Drawing Sheets

(51) Int. Cl.
*H01L 27/32* (2006.01)
*H01L 51/50* (2006.01)
*G06F 3/044* (2006.01)
*G09F 9/30* (2006.01)
*G02F 1/1335* (2006.01)

(52) U.S. Cl.
CPC ............ *G06F 3/044* (2013.01); *G09F 9/30* (2013.01); *H01L 27/32* (2013.01); *H01L 51/50* (2013.01); *G02F 2001/133541* (2013.01)

(56) References Cited

U.S. PATENT DOCUMENTS

| | | |
|---|---|---|
| 5,523,027 A | 6/1996 | Otsuka |
| 5,833,880 A | 11/1998 | Siemensmeyer et al. |
| 6,043,355 A | 3/2000 | Yashiro et al. |
| 6,115,095 A | 9/2000 | Suzuki et al. |
| 6,699,405 B2 | 3/2004 | Prechtl et al. |
| 6,762,811 B2 | 7/2004 | Sasaki et al. |
| 6,793,986 B2 | 9/2004 | Prechtl et al. |
| 7,023,513 B2 | 4/2006 | Sasaki et al. |
| 7,030,860 B1 | 4/2006 | Hsu et al. |
| 7,754,912 B2 | 7/2010 | Irisawa et al. |
| 7,771,616 B2 | 8/2010 | Irisawa et al. |
| 7,956,965 B2 | 6/2011 | Jeon et al. |
| 8,633,915 B2 | 1/2014 | Hotelling et al. |
| 8,823,653 B2 | 9/2014 | Matsuo |
| 8,947,368 B2 | 2/2015 | Jeong et al. |
| 9,128,578 B2 | 9/2015 | Omote et al. |
| 9,158,143 B2 | 10/2015 | Chen et al. |
| 9,317,165 B2 | 4/2016 | Hotelling et al. |
| 9,690,022 B2 | 6/2017 | Aimatsu |
| 2008/0068545 A1* | 3/2008 | Doi ............ B32B 27/36 349/118 |
| 2010/0309167 A1 | 12/2010 | Nam |
| 2011/0267561 A1 | 11/2011 | Nemoto et al. |
| 2011/0317112 A1 | 12/2011 | Asaoka et al. |
| 2014/0285888 A1* | 9/2014 | Tanaka ............ C08J 5/18 359/489.07 |
| 2015/0004397 A1* | 1/2015 | Horio ............ G02B 1/105 428/328 |
| 2016/0124131 A1* | 5/2016 | Kobayashi ............ G02B 5/3016 428/141 |
| 2016/0216808 A1 | 7/2016 | Hotelling et al. |
| 2016/0245972 A1* | 8/2016 | Yamanaka ............ B32B 27/08 |
| 2018/0157125 A1* | 6/2018 | Yasui ............ G02B 5/3033 |

FOREIGN PATENT DOCUMENTS

| | | |
|---|---|---|
| JP | H05100114 A | 4/1993 |
| JP | H0850206 A | 2/1996 |
| JP | H09127885 A | 5/1997 |
| JP | H1010523 A | 1/1998 |
| JP | H1068816 A | 3/1998 |
| JP | 2846091 B2 | 1/1999 |
| JP | H1152131 A | 2/1999 |
| JP | H11133408 A | 5/1999 |
| JP | H11513360 A | 11/1999 |
| JP | 2001004837 A | 1/2001 |
| JP | 2002030042 A | 1/2002 |
| JP | 3286905 B2 | 5/2002 |
| JP | 3366697 B2 | 1/2003 |
| JP | 2003511799 A | 3/2003 |
| JP | 2003114325 A | 4/2003 |
| JP | 2003177242 A | 6/2003 |
| JP | 2003331654 A | 11/2003 |
| JP | 2004109171 A | 4/2004 |
| JP | 2004204190 A | 7/2004 |
| JP | 2005181615 A | 7/2005 |
| JP | M 05263789 A | 9/2005 |
| JP | 2006285208 A | 10/2006 |
| JP | 2007119415 A | 5/2007 |
| JP | 2007186430 A | 7/2007 |
| JP | 2008517344 A | 5/2008 |
| JP | 2008310550 A | 12/2008 |
| JP | 2009122454 A | 6/2009 |
| JP | 4403257 B2 | 1/2010 |
| JP | 2010164938 A | 7/2010 |
| JP | 2010541109 A | 12/2010 |
| JP | 2011511357 A | 4/2011 |
| JP | 2011175601 A | 9/2011 |
| JP | 2012018634 A | 1/2012 |
| JP | 2013152690 A | 8/2013 |
| JP | 2015031753 A | 2/2015 |
| JP | 2015125436 A | 7/2015 |
| WO | 9524454 A1 | 9/1995 |
| WO | 0127868 A1 | 4/2001 |
| WO | 2006107148 A1 | 10/2006 |
| WO | 2009046363 A1 | 4/2009 |
| WO | 2009096706 A2 | 8/2009 |
| WO | 2010131387 A1 | 11/2010 |
| WO | 2010137200 A1 | 12/2010 |
| WO | 2014069515 A1 | 5/2014 |
| WO | 2015064581 A1 | 5/2015 |

OTHER PUBLICATIONS

Feb. 13, 2018, International Search Report issued in the International Patent Application No. PCT/JP2017/042583.

Jinshan Zhang et al., Liquid Crystals Based on Shape-Persistent Macrocyclic Mesogens, J. Am. Chem. Soc., 1994, p. 2655, vol. 116.

The Chemical Society of Japan, Chemistry of Liquid Crystal, Kikan Kagaku Sosetsu, 1994, No. 22, Chapter 5 and Chapter 10 Section 2.

Jun. 4, 2019, International Preliminary Report on Patentability issued in the International Patent Application No. PCT/JP2017/042583.

* cited by examiner

OPTICAL LAMINATE, CIRCULARLY POLARIZING PLATE, TOUCH PANEL, AND IMAGE DISPLAY DEVICE

FIELD

The present invention relates to an optical layered body and a circular polarizing plate, a touch panel, and an image display device which have the optical layered body.

BACKGROUND

Most of automatic teller machines (ATMs) of financial institutions; automatic vending machines; and digital information equipment such as mobile phones, personal digital assistances (PDAs), digital audio players, portable game machines, and car navigation systems have image display devices, and these image display devices often have touch panels as input units. Particularly, smartphones with touch panels are becoming more popular as mobile phones. Such a touch panel usually has a film sensor member including a transparent substrate and a transparent electroconductive layer formed on the substrate (Patent Literatures 1 and 2).

Examples of known types of the touch panel include an electrostatic capacitive type, an optical type, an ultrasonic type, an electromagnetic induction type, and a resistive film type. Of these, the electrostatic capacitive touch panels, which are used as input units by detecting a change in a capacitance between the tip of a finger and a transparent electroconductive layer are currently mainly used together with the resistive touch panels. Particularly, devices called tablet PCs are generally equipped with capacitive touch panels. As substrates of film sensor members for capacitive touch panel, glass substrates are widely used in prior art. Recently, however, the use of resin films is being studied in consideration of the thickness and flexibility of substrates.

Further, image display devices generally have optical films such as λ/4 plates and λ/2 plates. Such optical films and image display devices have heretofore been studied in various ways (see Patent Literatures 3 to 18).

CITATION LIST

Patent Literature

Patent Literature 1: Japanese Patent Application Laid-Open No. 2013-152690 A
Patent Literature 2: U.S. Pat. No. 9,158,143
Patent Literature 3: International Publication No. 2010/131387
Patent Literature 4: Japanese Patent Application Laid-Open No. Hei. 05-100114 A
Patent Literature 5: Japanese Patent Application Laid-Open No. 2003-114325 A
Patent Literature 6: Japanese Patent Application Laid-Open No. Hei. 10-68816 A
Patent Literature 7: Japanese Patent Application Laid-Open No. 2005-181615 A
Patent Literature 8: Japanese Patent Application Laid-Open No. 2015-31753 A
Patent Literature 9: Japanese Patent Application Laid-Open No. Hei. 10-10523 A
Patent Literature 10: Japanese Patent Application Laid-Open No. Hei. 1-204092 A
Patent Literature 11: Japanese Patent Application Laid-Open No. Hei. 3-174512 A
Patent Literature 12: Japanese Patent Application Laid-Open No. 2009-122454 A
Patent Literature 13: Japanese Patent Application Laid-Open No. 2004-109171 A
Patent Literature 14: Japanese Patent Application Laid-Open No. 2001-4837 A
Patent Literature 15: Japanese Patent Application Laid-Open No. Hei. 11-52131 A
Patent Literature 16: Japanese Patent Application Laid-Open No. 2005-181615 A
Patent Literature 17: Japanese Patent Application Laid-Open No. 2015-031753 A
Patent Literature 18: International Publication No. 2010/137200

SUMMARY

Technical Problem

In general, when a layer containing a liquid crystal compound is formed and the liquid crystal compound contained in this layer is polymerized, the orientation state of the liquid crystal compound is fixed and thereby a liquid crystal cured layer having specific optical properties can be obtained. Such a liquid crystal cured layer has a tendency to express a large retardation even when its thickness is small. Therefore, the present inventor made an attempt to provide a liquid crystal cured layer in an optical film to reduce the thickness of the optical film.

However, when such an optical film is provided in an image display device having a touch panel, sometimes the liquid crystal cured layer may be deteriorated due to outside light, and thereby the optical properties, such as retardation, of the optical film may be changed. Particularly, touch panels have come to be used in various environments, and therefore opportunities of the use of image display devices having touch panels in environments with much outside light has recently increased. Therefore, there has been demand for the development of a technique capable of suppressing a change in optical properties due to outside light.

In light of the above-described problem, it is an object of the present invention to provide an optical layered body capable of suppressing a change in optical properties due to outside light and a circular polarizing plate, a touch panel, and an image display device which have such an optical layered body.

Solution to Problem

In order to achieve the above-described object, the present inventor has intensively studied, and as a result, has found that an optical layered body capable of suppressing a change in optical properties due to outside light can be achieved by using a substrate layer having a low light transmittance at a wavelength of 390 nm and a liquid crystal cured layer in combination. This finding has led to the completion of the present invention.

That is, the present invention includes the following.
<1> An optical layered body comprising a substrate layer, and an optically anisotropic layer containing at least one liquid crystal cured layer, wherein
a light transmittance of the substrate layer at a wavelength of 390 nm is 1% or less, and
an in-plane retardation Re0(450) at a wavelength 450 nm before the optical layered body is exposed to the xenon lamp, an in-plane retardation Re0(550) at a wavelength 550 nm before the optical layered body is exposed to the xenon lamp, an in-plane retardation Re300(450) at the wavelength 450 nm after the optical layered body was exposed to the xenon lamp for 300 hours, and an in-plane retardation Re300(550) at the wavelength 550 nm after the optical layered body was exposed to the xenon lamp for 300 hours satisfy the following formulae (1) and (2):

$$0.95 \leq Re300(450)/Re0(450) \leq 1.05 \quad (1),$$

$$0.95 \leq Re300(550)/Re0(550) \leq 1.05 \quad (2).$$

<2> The optical layered body according to <1>, wherein an in-plane retardation Re0(650) at a wavelength of 650 nm before the optical layered body is exposed to the xenon lamp and an in-plane retardation Re300(650) at the wavelength of 650 nm after the optical layered body was exposed to the xenon lamp for 300 hours satisfy the following formula (3):

$$0.95 \leq Re300(650)/Re0(650) \leq 1.05 \quad (3).$$

<3> The optical layered body according to <1> or <2>, wherein
  an in-plane retardation of the substrate layer is 5 nm or less, and
  a thickness-direction retardation of the substrate layer is 15 nm or less.
<4> The optical layered body according to any one of <1> to <3>, wherein the substrate layer includes a first outer layer, an intermediate layer containing an ultraviolet absorber, and a second outer layer in this order.
<5> The optical layered body according to any one of <1> to <4>, comprising an electroconductive layer.
<6> The optical layered body according to any one of <1> to <5>, wherein the optically anisotropic layer functions as a λ/4 plate.
<7> The optical layered body according to any one of <1> to <5>, wherein the optically anisotropic layer functions as a λ/2 plate.
<8> The optical layered body according to any one of <1> to <6>, wherein the optically anisotropic layer includes the liquid crystal cured layer functioning as one of a λ/4 plate and a λ/2 plate, and a layer functioning as the other of the λ/4 plate and the λ/2 plate, and functions as a broadband λ/4 plate.
<9> The optical layered body according to any one of <1> to <8>, wherein a light transmittance of the liquid crystal cured layer at a wavelength of 390 nm is 70% or more.
<10> A circular polarizing plate comprising the optical layered body according to any one of <1> to <9>, and a linear polarizer.
<11> A touch panel comprising the circular polarizing plate according to <10>.
<12> An image display device comprising an image display element, and the circular polarizing plate according to <10> provided on a viewing side of the image display element.
<13> The image display device according to <12>, wherein the image display element is a liquid crystal cell or an organic electroluminescent element.

Advantageous Effects of Invention

According to the present invention, an optical layered body capable of suppressing a change in optical properties due to outside light; and a circular polarizing plate, a touch panel, and an image display device which have such an optical layered body can be provided.

DESCRIPTION OF EMBODIMENTS

Figure 1:
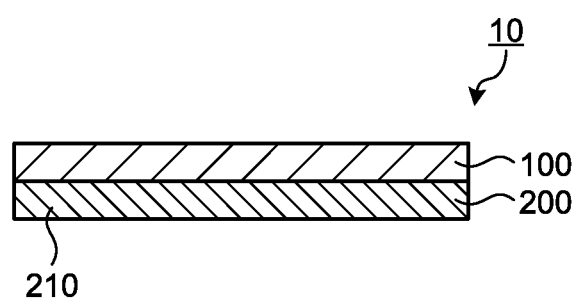
FIG. 1 is a cross-sectional view schematically showing an example of an optical layered body of the present invention.

The present invention will be described hereinbelow in detail with reference to embodiments and examples. However, the present invention is not limited to the following embodiments and examples, and may be freely modified for implementation without departing from the scope of claims of the present invention and the scope of their equivalents.

In the following description, "ultraviolet light" refers to light with a wavelength of 10 nm to 400 nm unless otherwise specified.

In the following description, a "long-length" shape refers to a shape with the length that is 5 times or more the width, and preferably a shape with the length that is 10 times or more the width, and specifically refers to a shape of a film having a length that allows a film to be wound up into a rolled shape for storage or transportation. The upper limit of the length of the long-length shape is not particularly limited, but may be 100,000 times or less the width thereof, for example.

In the following description, an in-plane retardation Re of a film and a layer is a value represented by Re=(nx−ny)×d unless otherwise specified. A thickness-direction retardation Rth of a film and a layer is a value represented by Rth={(nx+ny)/2−nz}×d unless otherwise specified. Herein, nx represents a refractive index in a direction in which the maximum refractive index is given among directions perpendicular to the thickness direction of the film and layer (in-plane directions), ny represents a refractive index in a direction, among the above-mentioned in-plane directions of the film and layer, orthogonal to the direction giving nx, nz represents a refractive index in the thickness direction of the film and layer, and d represents the thickness of the film and layer. The measurement wavelength is 550 nm unless otherwise specified.

In the following description, a front direction of a certain surface means the normal direction of the surface, and specifically in the direction at the polar angle 0° and the azimuth angle 0° with respect to the surface, unless otherwise specified.

In the following description, a tilt direction of a certain surface means a direction which is neither parallel nor perpendicular to the surface, specifically, in the direction in a polar angle range of larger than 0° and smaller than 90° of the surface, unless otherwise specified.

In the following description, the "forward wavelength distribution property" refers to a property in which the in-plane retardations Re(450) and Re(550) at wavelengths 450 nm and 550 nm satisfy the relationship of Re(450)>Re(550) unless otherwise specified.

In the following description, the "reverse wavelength distribution property" refers to a property in which the in-plane retardations Re(450) and Re(550) at wavelengths 450 nm and 550 nm satisfy the relationship of Re(450)<Re(550) unless otherwise specified.

In the following description, a slow axis of a layer represents a slow axis in the plane of the layer unless otherwise specified.

In the following description, an angle formed by an optical axis (polarized light absorption axis, polarized light transmission axis, slow axis, etc.) of a film or layer in a member including a plurality of films or layers represents an angle when the film or layer is viewed from the thickness direction unless otherwise specified.

In the following description, the term "(meth)acryloyl group" encompasses an acryloyl group, a methacryloyl group, and a combination thereof.

In the following description, a resin having a positive intrinsic birefringence value means a resin whose refractive index in the stretching direction becomes larger than the refractive index in a direction perpendicular thereto unless otherwise specified. Also, a resin having a negative intrinsic birefringence value means a resin whose refractive index in the stretching direction becomes smaller than the refractive index in the direction perpendicular thereto unless otherwise specified. The intrinsic birefringence value may be calculated from the permittivity distribution.

In the following description, an oblique direction of a long-length film refers to a direction which is in the in-plane direction of the film and is neither parallel nor perpendicular to the width direction of the film unless otherwise noted.

In the following description, a "polarizing plate", a "λ/2 plate" and a "λ/4 plate" are not only a rigid member, but also, for example, a flexible member such as a resin film, unless otherwise specified.

[1. Summary of Optical Layered Body]

FIG. 1 is a cross-sectional view schematically showing an example of an optical layered body of the present invention.

As shown in FIG. 1, an optical layered body 10 includes a substrate layer 100 and an optically anisotropic layer 200 containing at least one liquid crystal cured layer 210. Although FIG. 1 shows an example of the optical layered body 10 whose optically anisotropic layer 200 contains only a single liquid crystal cured layer 210, the structure of the optically anisotropic layer 200 is not limited to the example shown in FIG. 1.

The substrate layer 100 has a function of suppressing the transmission of ultraviolet light. Specifically, the substrate layer 100 has a low light transmittance at a wavelength of 390 nm. Since the substrate layer 100 suppresses the transmission of ultraviolet light having a wavelength of 390 nm that has not heretofore drawn attention, it is possible to suppress a change in the optical properties of the liquid crystal cured layer 210 contained in the optically anisotropic layer 200 of the optical layered body 10 due to ultraviolet light. Therefore, it is possible to suppress a change in the optical properties of the optical layered body 10 itself.

[2. Substrate Layer]

The substrate layer has a low light transmittance at a wavelength of 390 nm. Specific light transmittance of the substrate layer at a wavelength of 390 nm is usually 1% or less, preferably 0.5% or less, more preferably 0.2% or less, and ideally 0%. Since the substrate layer having such a low light transmittance at a wavelength of 390 nm can reduce ultraviolet light that enters the liquid crystal cured layer through the substrate layer, it is possible to suppress a change in the optical properties of the liquid crystal cured layer due to ultraviolet light. Therefore, it is possible to suppress a change in the optical properties of the optical layered body containing such a liquid crystal cured layer due to ultraviolet light. Further, when a circular polarizing plate including such an optical layered body is produced, it is usually possible to suppress a reduction in the polarization degree of a linear polarizer and the coloration of a linear polarizer. In general, organic components contained in organic electroluminescent element (this may be appropriately referred to hereinbelow as "organic EL element") particularly easily deteriorate due to long-wavelength ultraviolet light. However, the optical layered body including the above-described substrate layer having a low light transmittance at a wavelength of 390 nm can usually suppress deterioration of organic components contained in an organic EL element due to ultraviolet light particularly effectively. Therefore, when the above-described circular polarizing plate is provided to an organic electroluminescence display device (this may be appropriately referred to hereinbelow as "organic EL display device"), the organic EL display device can have a long lifetime.

Such a substrate layer can be achieved by using a resin having the function of absorbing ultraviolet light, and may be obtained as, for example, a resin layer containing an ultraviolet absorber. In particular, from the viewpoint of suppressing bleed-out of the ultraviolet absorber from the substrate layer, the substrate layer preferably includes a first outer layer, an intermediate layer containing an ultraviolet absorber, and a second outer layer in this order. An example of such a substrate layer having a first outer layer, an intermediate layer, and a second outer layer will be described hereinbelow with reference to the drawing.

Figure 2:
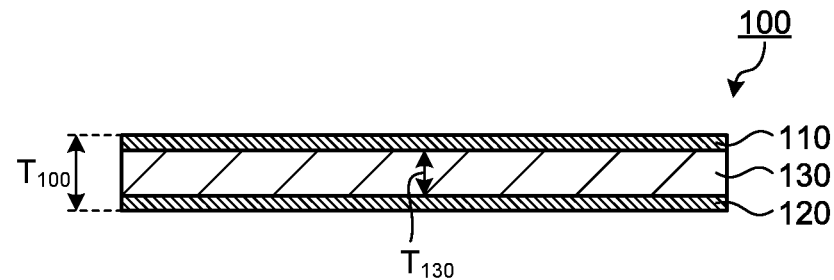
FIG. 2 is a cross-sectional view schematically showing a substrate layer as an example.

FIG. 2 is a cross-sectional view schematically showing the substrate layer 100 as an example. As shown in FIG. 2, the substrate layer 100 includes a first outer layer 110, a second outer layer 120, and an intermediate layer 130 provided between the first outer layer 110 and the second outer layer 120. The first outer layer 110 and the intermediate layer 130 are usually in direct contact with each other without another layer interposed therebetween, and the intermediate layer 130 and the second outer layer 120 are in direct contact with each other without another layer interposed therebetween.

In such a substrate layer 100, as the intermediate layer 130 contains an ultraviolet absorber, the transmission of ultraviolet light can be suppressed. Further, as the first outer layer 110 and the second outer layer 120 hinder the migration of the ultraviolet absorber contained in the intermediate layer 130, bleed-out of the ultraviolet absorber contained in the intermediate layer 130 can be suppressed. Since the use of such a substrate layer 100 allows high concentration of the ultraviolet absorber contained in the intermediate layer 130 and wide range of choice of the ultraviolet absorber, the substrate layer 100 can have a high ability to suppress transmission of ultraviolet light even when its thickness is small.

[2.1. Intermediate Layer 130]

The intermediate layer 130 is usually formed of a resin containing an ultraviolet absorber. Therefore, the resin usually contains a polymer and an ultraviolet absorber.

As the polymer, it is preferable to use a thermoplastic polymer because therewith the substrate layer 100 can be easily produced. Examples of such polymers may include a polyolefin such as polyethylene and polypropylene; a polyester such as polyethylene terephthalate and polybutylene terephthalate; a polyarylene sulfide such as polyphenylene sulfide; a polyvinyl alcohol; a polycarbonate; a polyarylate;

a cellulose ester polymer, a polyethersulfone; a polysulfone; a polyallylsulfone; a polyvinyl chloride; a polymer containing an alicyclic structure such as a norbornene polymer; a rod-like liquid crystal polymer; a polymer of styrene or a styrene derivative; a polyacrylonitrile; and a polymethylmethacrylate. As these polymers, one type thereof may be solely used, and two or more types thereof may also be used in combination at any ratio. The polymer may be a homopolymer or a copolymer. Among these, a polymer containing an alicyclic structure is preferable because of their excellent mechanical properties, heat resistance, transparency, low hygroscopicity, size stability, and light-weight property.

Examples of the polymer containing an alicyclic structure may include (1) a norbornene-based polymer, (2) a monocyclic olefin polymer, (3) a cyclic conjugated diene polymer, (4) a vinyl alicyclic hydrocarbon polymer, and hydrogenated products thereof. Of these, a norbornene-based polymer and a hydrogenated product thereof are more preferable from the viewpoints of transparency and moldability.

Examples of the norbornene-based polymer may include a ring-opening polymer of a norbornene monomer, a ring-opening copolymer of a norbornene monomer and another monomer ring-opening copolymerizable therewith, and hydrogenated products thereof; an addition polymer of a norbornene monomer, and an addition copolymer of a norbornene monomer and another monomer copolymerizable therewith. Of these, a hydrogenated product of a ring-opening polymer of a norbornene monomer; and a hydrogenated product of a ring-opening copolymer of a norbornene monomer and another monomer ring-opening copolymerizable therewith are particularly preferable from the viewpoint of transparency.

The polymers containing an alicyclic structure described above are selected from the polymers disclosed in, for example, Japanese Patent Application Laid-Open No. 2002-321302 A.

As the resins containing a polymer containing an alicyclic structure, various products are commercially available, and those having desired properties may be appropriately selected for use. Examples of such commercially available products may include ranges of the products of the trade names "ZEONOR" (manufactured by ZEON Corporation), "Arton" (manufactured by JSR Corporation), "Apel" (manufactured by Mitsui Chemicals Inc.) and "TOPAS" (manufactured by Polyplastics Corporation).

The weight-average molecular weight (Mw) of the polymer is preferably 10,000 or more, more preferably 15,000 or more, and particularly preferably 20,000 or more, and is preferably 100,000 or less, more preferably 80,000 or less, and particularly preferably 50,000 or less. When the weight-average molecular weight falls within such a range, the mechanical strength and the molding processability of the layer containing this polymer are highly balanced.

The molecular weight distribution (Mw/Mn) of the polymer is preferably 1.2 or more, more preferably 1.5 or more, and particularly preferably 1.8 or more, and is preferably 3.5 or less, more preferably 3.0 or less, and particularly preferably 2.7 or less. Herein, Mn represents the number-average molecular weight. With the molecular weight distribution being equal to or higher than the lower limit value of the aforementioned range, productivity of the polymer can be increased and production cost can be suppressed. When the molecular weight distribution is equal to or lower than the upper limit value, the amount of the low molecular component becomes small, and thereby relaxation at the time of high temperature exposure can be suppressed, and the stability of the layer containing the polymer can be enhanced.

The weight-average molecular weight (Mw) and the number-average molecular weight (Mn) may be measured as a polyisoprene or polystyrene-equivalent weight-average molecular weight by gel permeation chromatography using cyclohexane as a solvent. However, when the sample is not dissolved in cyclohexane, toluene may be used as the solvent.

The glass transition temperature of the polymer is preferably 100° C. or higher, more preferably 110° C. or higher, and particularly preferably 120° C. or higher, and is preferably 190° C. or lower, more preferably 180° C. or lower, and particularly preferably 170° C. or lower. When the glass transition temperature of the polymer is equal to or higher than the lower limit value of the aforementioned range, durability of the substrate layer 100 in a high temperature environment can be enhanced. When the glass transition temperature is equal to or lower than the upper limit value of the aforementioned range, handling property of the substrate layer 100 can be improved.

The amount of the polymer in the resin of the intermediate layer 130 is preferably 80.0% by weight or more, more preferably 82.0% by weight or more, and particularly preferably 84.0% by weight or more, and is preferably 97.0% by weight or less, more preferably 96.0% by weight or less, and particularly preferably 95.0% by weight or less. By keeping the amount of the polymer within the aforementioned range, the above-described advantages of the polymer can be effectively exhibited, and, for example, the heat and moisture resistance of the substrate layer 100 can be effectively improved. Consequently, when a circular polarizing plate including an optical layered body is produced, durability of the circular polarizing plate under a high humidity condition can be enhanced.

As the ultraviolet absorber, a compound capable of absorbing ultraviolet light may be used. The ultraviolet absorber for use may be a material that is capable of confining the light transmittance of the substrate layer 100 at a wavelength of 390 nm within a specific range that is 1% or less. Usually, organic compounds are used as such an ultraviolet absorber. The ultraviolet absorber as an organic compound may be referred to hereinbelow as an "organic ultraviolet absorber". Usually, by using the organic ultraviolet absorber, the light transmittance of the substrate layer 100 at the visible wavelength can be increased and the haze of the substrate layer 100 can be reduced. Consequently, the display performance of the image display device including the optical layered body can be improved.

Examples of the organic ultraviolet absorber may include a triazine-based ultraviolet absorber, a benzophenone-based ultraviolet absorber, a benzotriazole-based ultraviolet absorber, an acrylonitrile-based ultraviolet absorber, a salicylate-based ultraviolet absorber, a cyanoacrylate-based ultraviolet absorber, an azomethine-based ultraviolet absorber, an indole-based ultraviolet absorber, a naphthalimide-based ultraviolet absorber, and a phthalocyanine-based ultraviolet absorber.

As the triazine-based ultraviolet absorber, for example, a compound having a 1,3,5-triazine ring is preferable. Specific examples of the triazine-based ultraviolet absorbers may include 2-(4,6-diphenyl-1,3,5-triazine-2-yl)-5-[(hexyl)oxy]-phenol, and 2,4-bis(2-hydroxy-4-butoxyphenyl)-6-(2,4-dibutoxyphenyl)-1,3,5-triazine. Examples of a commercially-available product of such a triazine-based ultraviolet absorber may include "Tinuvin 1577" manufactured by Ciba Specialty Chemicals and "LA-F70" and "LA-46" manufactured by ADEKA Corporation.

Examples of the benzotriazole-based ultraviolet absorber may include 2,2'-methylenebis[4-(1,1,3,3-tetramethylbutyl)-6-(2H-benzotriazole-2-yl)phenol], 2-(3,5-di-tert-butyl-2-hydroxyphenyl)-5-chlorobenzotriazole, 2-(2H-benzotriazol-2-yl)-p-cresol, 2-(2H-benzotriazol-2-yl)-4,6-bis(1-methyl-1-phenylethyl)phenol, 2-benzotriazole-2-yl-4,6-di-tert-butylphenol, 2-[5-chloro(2H)-benzotriazol-2-yl]-4-methyl-6-(tert-butyl)phenol, 2-(2H-benzotriazol-2-yl)-4,6-di-tert-butylphenol, 2-(2H-benzotriazol-2-yl)-4-(1,1,3,3-tetramethylbutyl)phenol, 2-(2H-benzotriazol-2-yl)-4-methyl-6-(3,4,5,6-tetrahydrophthalimidylmethyl)phenol, a reaction product of methyl 3-(3-(2H-benzotriazol-2-yl)-5-tert-butyl-4-hydroxyphenyl)propionate/polyethylene glycol 300, and 2-(2H-benzotriazol-2-yl)-6-(linear and side-chain dodecyl)-4-methylphenol. Examples of the commercially-available product of such a triazole-based ultraviolet absorber may include "Adekastab LA-31" manufactured by ADEKA Corporation and "TINUVIN 326" manufactured by Ciba Specialty Chemicals.

Examples of the azomethine-based ultraviolet absorber may include the materials described in Japanese Patent No. 3366697 B. Examples of the commercially-available product of the azomethine-based ultraviolet absorber may include "BONASORB UA-3701" manufactured by Orient Chemical Industries Co., Ltd.

Examples of the indole-based ultraviolet absorber may include the materials described in Japanese Patent No. 2846091 B. Examples of the commercially-available product of the indole-based ultraviolet absorber may include "BONASORB UA-3911" and "BONASORB UA-3912" manufactured by Orient Chemical Industries Co., Ltd.

Examples of the phthalocyanine-based ultraviolet absorber may include the materials described in Japanese Patent Nos. 4403257 B and 3286905 B. Examples of the commercially-available product of the phthalocyanine-based ultraviolet absorber may include "FDB001" and "FDB002" manufactured by YAMADA CHEMICAL CO., LTD.

Particularly preferable examples of the ultraviolet absorber may include: "LA-F70" that is a triazine-based ultraviolet absorber manufactured by ASDEKA Corporation; "UA-3701" that is an azomethine-based ultraviolet absorber manufactured by ORIENT CHEMICAL INDUSTRIES CO., LTD.; and "Tinuvin 326" and "LA-31" that are benzotriazole-based ultraviolet absorbers manufactured by BASF and ADEKA Corporation, respectively. These ultraviolet absorbers have a particularly excellent ability to absorb ultraviolet light at a wavelength of around 390 nm, and therefore even a small amount thereof can reduce the light transmittance at a wavelength of 390 nm to a particularly low level.

As the ultraviolet absorbers, one type thereof may be solely used, and two or more types thereof may also be used in combination at any ratio.

The amount of the ultraviolet absorber in the resin of the intermediate layer 130 is preferably 3% by weight or more, more preferably 4% by weight or more, and particularly preferably 5% by weight or more, and is preferably 20% by weight or less, more preferably 18% by weight or less, and particularly preferably 16% by weight or less. When the amount of the ultraviolet absorber is equal to or more than the lower limit value of the above-described range, the transmission of ultraviolet light can be effectively suppressed by the substrate layer 100. On the other hand, when the amount of ultraviolet light is equal to or less than the upper limit value of the above-described range, the substrate layer 100 can easily have a high light transmittance at visible wavelengths. Further, gelation of the resin due to the ultraviolet absorber upon the production of the substrate layer 100 can be suppressed, and thereby occurrence of fish eyes in the substrate layer 100 can be easily suppressed. Herein, the fish eyes refer to irregular matters that may be generated in the substrate layer 100.

The resin of the intermediate layer 130 may further contain an optional component in addition to the polymer and the ultraviolet absorber. Examples of the optional component may include additives such as a coloring agent such as a pigment and a dye; a plasticizer; a fluorescent whitening agent; a dispersant; a heat stabilizer; a light stabilizer; an antistatic agent; an antioxidant; and a surfactant. As these additives, one type thereof may be solely used, and two or more types thereof may also be used in combination at any ratio.

It is preferable that the thickness of the intermediate layer 130 is set so that the ratio $T_{130}/T_{100}$ of the thickness $T_{130}$ of the intermediate layer 130 relative to the thickness $T_{100}$ of the substrate layer 100 falls within a specific range. Specifically, the thickness ratio $T_{130}/T_{100}$ is preferably ¼ or more, and more preferably ⅔ or more, and is preferably 80/82 or less, more preferably 79/82 or less, and particularly preferably 78/82 or less. When the thickness ratio is equal to or more than the above-described lower limit value, the transmission of ultraviolet light can be effectively suppressed by the substrate layer 100. On the other hand, when the thickness ratio is equal to or less than the above-described upper limit value, the first outer layer 110 and the second outer layer 120 can be made thick, and thereby bleed-out of the ultraviolet absorber can be stably suppressed, and the substrate layer 100 can be easily produced.

The thickness of each layer contained in the optical layered body may be measured in the following manner. The optical layered body is embedded in an epoxy resin to prepare a sample. The sample is sliced with a microtome into pieces having a thickness of 0.05 µm. Then, the cross section of the piece of the sample that appeared by slicing is observed with a microscope. In this manner, the thickness of each layer contained in the optical layered body can be measured.

[2.2. First Outer Layer]

The first outer layer 110 is usually formed of a resin. This resin preferably has a lower content of the ultraviolet absorber than that of the resin of the intermediate layer 130, and more preferably does not contain an ultraviolet absorber. Therefore, it is preferable that the resin of the first outer layer 110 contains a polymer and optionally contains an optional component other than an ultraviolet absorber if necessary.

As the polymer contained in the resin of the first outer layer 110, any polymer selected from the range described as the polymer contained in the resin of the intermediate layer 130 may be used. With this polymer, the same advantages as described in the description of the polymer included in the resin of the intermediate layer 130 can be obtained. Of these, the same polymer as the polymer contained in the resin of the intermediate layer 130 is preferably used as the polymer contained in the resin of the first outer layer 110. By selecting such a polymer, bonding strength between the intermediate layer 130 and the first outer layer 110 can be easily enhanced, and reflection of light at the interface between the intermediate layer 130 and the first outer layer 110 can be easily suppressed.

The amount of the polymer in the resin of the first outer layer 110 is preferably 90.0% by weight to 100% by weight, and more preferably 95.0% by weight to 100% by weight. By setting the amount of the polymer in the aforementioned range, heat and moisture resistance and mechanical strength of the substrate layer 100 can be effectively increased.

The resin of the first outer layer 110 may further contain an optional component in combination with the polymer. Examples of the optional components may include components that are the same as those mentioned as the optional components that may be contained in the resin of the intermediate layer 130. As these optional components, one type thereof may be solely used, and two or more types thereof may also be used in combination at any ratio.

The thickness of the first outer layer 110 is preferably 3 μm or more, more preferably 5 μm or more, and particularly preferably 7 μm or more, and is preferably 15 μm or less, more preferably 13 μm or less, and particularly preferably 10 μm or less. When the thickness of the first outer layer 110 is equal to or greater than the lower limit value of the aforementioned range, bleed-out of the ultraviolet absorber contained in the intermediate layer 130 can be effectively suppressed. In addition, since the thickness of the first outer layer 110 is equal to or less than the upper limit value of the aforementioned range, thickness of the optical layered body can be reduced.

[2.3. Second Outer Layer]

The second outer layer 120 is usually formed of a resin. As the resin, any resin selected from the range of the resin described as the resin of the first outer layer 110 may be used. Therefore, the resin content component and properties of the second outer layer 120 may be selected and adopted from the ranges described as the resin content component and properties of the first outer layer 110. With this resin, the same advantages as those described in the description of the resin of the first outer layer 110 can be obtained.

The resin of the second outer layer 120 may be a resin different from the resin of the first outer layer 110. Alternatively, the resin of the second outer layer 120 may be the same resin as the resin of the first outer layer 110. Of these, it is preferable to use the same resin as the resin of the first outer layer 110 and the resin of the second outer layer 120. By using the same resin as the resin of the first outer layer 110 and the resin of the second outer layer 120, the production cost of the substrate layer 100 can be suppressed, and curling of the substrate layer 100 can be suppressed.

The thickness of the second outer layer 120 may be any thickness selected from the range described as the range for the thickness of the first outer layer 110. With this thickness, the same advantages as those described in the description of the thickness of the first outer layer 110 can be obtained. Of these, in order to suppress curling of the substrate layer 100, the thickness of the second outer layer 120 is preferably the same as that of the first outer layer 110.

[2.4. Optional Layer that the Substrate Layer May Contain]

The substrate layer 100 including the first outer layer 110, the intermediate layer 130, and the second outer layer 120 may include an optional layer other than the first outer layer 110, the intermediate layer 130, and the second outer layer 120 described above, if necessary. However, from the viewpoint of reducing thickness of the optical layered body, it is preferable that the substrate layer 100 is a layer having a three-layer structure without containing an optional layer.

[2.5. Properties and Thickness of Substrate Layer]

It is preferable that the substrate layer has a low transmittance not only for ultraviolet light having a wavelength of 390 nm but also for ultraviolet light having a wavelength other than 390 nm. For example, the light transmittance of the substrate layer at a wavelength of 380 nm is preferably 1.5% or less, and more preferably 1% or less. With such light transmittance, the ability of the substrate layer to block ultraviolet light can be further enhanced.

It is preferable that the substrate layer is an optically isotropic layer. Therefore, it is preferable that the in-plane retardation and the thickness-direction retardation of the substrate layer are small. Specifically, the in-plane retardation of the substrate layer is preferably 5 nm or less, more preferably 4 nm or less, particularly preferably 2 nm or less, and ideally 0 nm. The thickness-direction retardation of the substrate layer is preferably 15 nm or less, more preferably 13 nm or less, and particularly preferably 10 nm or less. The lower limit is not particularly limited, and is ideally 0 nm, but is usually 5 nm or more. When the substrate layer is optically isotropic in this manner, it is possible to suppress coloration of a display screen and improve viewing angle properties when the optical layered body is used in a display device.

It is preferable that the substrate layer has a high light transmittance at a visible wavelength from the viewpoint of stably allowing the optical layered body to exert the function as an optical member. For example, the light transmittance of the substrate layer in the wavelength range of 400 nm to 700 nm is preferably 85% to 100%, more preferably 87% to 100%, and particularly preferably 90% to 100%.

In addition, it is preferable that the substrate layer has a high light transmittance, particularly for visible light having a wavelength close to ultraviolet light, from the viewpoint of suppressing unintentional coloration of an image in the case where the optical layered body is provided to an image display device. Specifically, the light transmittance of the substrate layer at a wavelength of 430 nm is preferably 80% or more, more preferably 85 or more, particularly preferably 90% or more, and ideally 100%.

It is preferable that the substrate layer has a small haze from the viewpoint of enhancing the image sharpness of the image display device incorporating the optical layered body. The specific haze of the substrate layer is preferably 1% or less, more preferably 0.8% or less, and particularly preferably 0.5% or less. Haze may be measured using a turbidimeter according to JIS K7361-1997.

The amount of the volatile components contained in the substrate layer is preferably 0.1% by weight or less, more preferably 0.05% by weight or less, and still more preferably 0.02% by weight or less. When the amount of the volatile component falls within the aforementioned range, size stability of the substrate layer is improved, and a change with the lapse of time in optical properties such as retardation can be reduced. Furthermore, deterioration of the circular polarizing plate and the image display device can be suppressed, and display of the image display device can be stably and satisfactorily maintained for a long period of time. Herein, the volatile component is a substance having a molecular weight of 200 or less. Examples of the volatile components may include residual monomers and solvents. The amount of the volatile components may be quantified by gas chromatography analysis as the sum of the substances having a molecular weight of 200 or less.

The saturated water absorption of the substrate layer is preferably 0.05% or less, more preferably 0.03% or less, particularly preferably 0.01% or less, and ideally 0%. When the substrate layer has such a low saturated water absorption, a continuing change in the optical properties of the substrate layer can be suppressed.

The saturated water absorption of the substrate layer may be measured by the following procedure in accordance with JIS K7209.

The substrate layer is dried at 50° C. for 24 hours and cooled in a desiccator. Then, the weight (M1) of the dried substrate layer is measured.

The substrate layer is saturated with water by immersing it in water in a room at a temperature of 23° C. and a relative humidity of 50% for 24 hours. Then, the substrate layer is taken out of the water, and the weight (M2) of the substrate layer after immersion for 24 hours is measured.

From these measured values of weight, the saturated water absorption of the substrate layer may be determined by the following formula.

Saturated water absorption (%)=[(M2−M1)/M1]×100 (%)

The thickness of the substrate layer is preferably 15 μm or more, more preferably 20 μm or more, and particularly preferably 25 μm or more, and is preferably 50 μm or less, more preferably 45 μm or less, and particularly preferably 40 μm or less. When the thickness of the substrate layer is larger than the above-mentioned lower limit value, the light transmittance of the substrate layer at a wavelength of 390 nm can be lowered. In addition, since the thickness of the substrate layer is equal to or less than the above-mentioned upper limit value, weight reduction and space saving of the optical layered body can be realized.

[2.6. Method for Producing Substrate Layer]

The method for producing the substrate layer is not limited. For example, the substrate layer 100 including the first outer layer 110, the intermediate layer 130, and the second outer layer 120 as shown in FIG. 2 may be produced by a production method including a step of molding a resin for forming each layer into a film shape. Examples of the resin molding method may include a co-extrusion method and a co-casting method. Of these molding methods, a co-extrusion method is preferable because it is excellent in production efficiency and it is less likely to leave volatile components in the film.

[3. Optically Anisotropic Layer]

The optically anisotropic layer is a layer having at least one liquid crystal cured layer. The optically anisotropic layer may have two or more liquid crystal cured layers. The optically anisotropic layer may have an optional layer in combination with the liquid crystal cured layer. Usually, since the liquid crystal cured layer has an optical anisotropy, the optically anisotropic layer also has an optical anisotropy.

[3.1. Liquid Crystal Cured Layer]

The liquid crystal cured layer is a layer formed of a cured product of a material containing a liquid crystal compound. In the following description, the material containing the liquid crystal compound may be referred to as a "liquid crystal composition". However, the term "liquid crystal composition" includes not only a material containing two or more types of components, but also a material containing only one type of a liquid crystal compound.

A liquid crystal compound is a compound that is capable of exhibiting a liquid crystal phase when mixed in a liquid crystal composition and oriented. As such a liquid crystal compound, a polymerizable liquid crystal compound is usually used. Herein, the polymerizable liquid crystal compound is a liquid crystal compound that is capable of being polymerized ing in a liquid crystal composition in a state of exhibiting a liquid crystal phase to be a polymer while maintaining the orientation of molecules in the liquid crystal phase.

Examples of the polymerizable liquid crystal compound may include a liquid crystal compound having a polymerizable group, a compound capable of forming a side chain-type liquid crystal polymer, and a compound such as a discotic liquid crystal compound. Of these, a photopolymerizable compound capable of being polymerized by irradiation with light such as visible light, ultraviolet light, and infrared light is preferable. Examples of the liquid crystal compound having a polymerizable group may include rod-shaped liquid crystal compounds having a polymerizable group described in Japanese Patent Application Laid-Open No. Hei. 11-513360 A, Japanese Patent Application Laid-Open No. 2002-030042 A, Japanese Patent Application Laid-Open No. 2004-204190 A, Japanese Patent Application Laid-Open No. 2005-263789 A, Japanese Patent Application Laid-Open No. 2007-119415 A, Japanese Patent Application Laid-Open No. 2007-186430 A, and the like. Examples of the side chain-type liquid crystal polymer compound may include side chain-type liquid crystal polymer compounds described in Japanese Patent Application Laid-Open No. 2003-177242 A and the like. Examples of preferable commercial product names of the liquid crystal compounds may include "LC242" manufactured by BASF Corporation. Specific examples of the discotic liquid crystal compound are described in Japanese Patent Application Laid-Open No. Hei. 8-50206 A, literatures (C. Destrade et al., Mol. Cryst. Liq. Cryst., vol. 71, page 111 (1981); Quarterly Chemical Review by the Chemical Society of Japan, No. 22, Chemistry of Liquid Crystals, Chapter 5, Section 2 of Chapter 10 (1994); J. Zhang et al., J. Am. Chem. Soc., vol. 116, page 2655 (1994)), and J. Lehn et al., J. Chem. Soc., Chem. Commun., page 1794 (1985). As the liquid crystal compounds, one type thereof may be solely used, and two or more types thereof may also be used in combination at any ratio.

The liquid crystal compound may be a reverse wavelength distribution liquid crystal compound. Herein, the reverse wavelength distribution liquid crystal compound refers to a liquid crystal compound which exhibits a reverse wavelength distribution property when it is homogeneously oriented. That the liquid crystal compound is homogeneously oriented refers to that a layer containing the liquid crystal compound is formed, and the long axis direction of the mesogens of the molecules of the liquid crystal compound in the layer is oriented in one direction parallel to the plane of the layer. When the liquid crystal compound contains a plurality of types of mesogens having different orientation directions, the direction in which the longest type of mesogens are oriented is the orientation direction. Whether or not the liquid crystal compound is homogeneously oriented, and the orientation direction thereof may be confirmed by measurement of the slow axis direction using a phase difference meter typified by AxoScan (Axometrics Inc.), and measurement of retardation distributions for each incident angle in the slow axis direction. By using the reverse wavelength distribution liquid crystal compound as a part or all of the liquid crystal compound included in the liquid crystal composition, a liquid crystal cured layer exhibiting a reverse wavelength distribution property can be easily obtained.

For example, a compound containing a main chain mesogen and a side chain mesogen bonded to the main chain mesogen in the molecule of the compound is preferably used as a liquid crystal compound, and more preferably as a reverse wavelength distribution liquid crystal compound. The aforementioned reverse wavelength distribution liquid crystal compound containing a main chain mesogen and a side chain mesogen may be oriented while the side chain mesogens are oriented in a direction different from that of the main chain mesogens while being in a state where the reverse wavelength distribution liquid crystal compound is oriented. In such a case, birefringence appears as a difference between the refractive index corresponding to the main chain mesogen and the refractive index corresponding to the side chain mesogen. As a result, the reverse wavelength distribution liquid crystal compound can exhibit a reverse wavelength distribution property when it is homogeneously oriented.

Examples of the polymerizable reverse wavelength distribution liquid crystal compound may include compounds exhibiting a liquid crystal property among compounds represented by the following formula (Ia). In the following description, the compound represented by the formula (Ia) may be appropriately referred to as a "compound (Ia)".

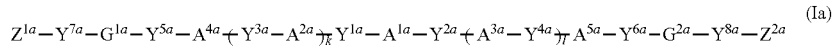

$$Z^{1a}-Y^{7a}-G^{1a}-Y^{5a}-A^{4a}+Y^{3a}-A^{2a}\overline{\jmath_k}Y^{1a}-A^{1a}-Y^{2a}+A^{3a}-Y^{4a}\overline{\jmath_l}A^{5a}-Y^{6a}-G^{2a}-Y^{8a}-Z^{2a} \quad (Ia)$$

In the aforementioned formula (Ia), $A^{1a}$ represents an aromatic hydrocarbon ring group having, as a substituent, an organic group of 1 to 67 carbon atoms having at least one aromatic ring selected from the group consisting of an aromatic hydrocarbon ring and an aromatic heterocyclic ring; or an aromatic heterocyclic ring group having, as a substituent, an organic group of 1 to 67 carbon atoms having at least one aromatic ring selected from the group consisting of an aromatic hydrocarbon ring and an aromatic heterocyclic ring.

Specific examples of $A^{1a}$ may include a phenylene group substituted with a group represented by the formula: —$R^fC$(=N—N($R^g$)$R^h$) or the formula: —$R^fC$(=N—N=C($R^{f1}$)$R^h$); a benzothiazole-4,7-diyl group substituted with a 1-benzofuran-2-yl group; a benzothiazole-4,7-diyl group substituted with a 5-(2-butyl)-1-benzofuran-2-yl group; a benzothiazole-4,7-diyl group substituted with a 4,6-dimethyl-1-benzofuran-2-yl group; a benzothiazole-4,7-diyl group substituted with a 6-methyl-1-benzofuran-2-yl group; a benzothiazole-4,7-diyl group substituted with a 4,6,7-trimethyl-1-benzofuran-2-yl group; a benzothiazole-4,7-diyl group substituted with a 4,5,6-trimethyl-1-benzofuran-2-yl group; a benzothiazole-4,7-diyl group substituted with a 5-methyl-1-benzofuran-2-yl group; a benzothiazole-4,7-diyl group substituted with a 5-propyl-1-benzofuran-2-yl group; a benzothiazole-4,7-diyl group substituted with a 7-propyl-1-benzofuran-2-yl group; a benzothiazole-4,7-diyl group substituted with a 5-fluoro-1-benzofuran-2-yl group; a benzothiazole-4,7-diyl group substituted with a phenyl group; a benzothiazole-4,7-diyl group substituted with a 4-fluorophenyl group; a benzothiazole-4,7-diyl group substituted with a 4-nitrophenyl group; a benzothiazole-4,7-diyl group substituted with a 4-trifluoromethylphenyl group; a benzothiazole-4,7-diyl group substituted with a 4-cyanophenyl group; a benzothiazole-4,7-diyl group substituted with a 4-methanesulfonylphenyl group; a benzothiazole-4,7-diyl group substituted with a thiophene-2-yl group; a benzothiazole-4,7-diyl group substituted with a thiophene-3-yl group; a benzothiazole-4,7-diyl group substituted with a 5-methylthiophene-2-yl group; a benzothiazole-4,7-diyl group substituted with a 5-chlorothiophene-2-yl group; a benzothiazole-4,7-diyl group substituted with a thieno[3,2-b]thiophene-2-yl group; a benzothiazole-4,7-diyl group substituted with a 2-benzothiazolyl group; a benzothiazole-4,7-diyl group substituted with a 4-biphenyl group; a benzothiazole-4,7-diyl group substituted with a 4-propylbiphenyl group; a benzothiazole-4,7-diyl group substituted with a 4-thiazolyl group; a benzothiazole-4,7-diyl group substituted with a 1-phenylethylene-2-yl group; a benzothiazole-4,7-diyl group substituted with a 4-pyridyl group; a benzothiazole-4,7-diyl group substituted with a 2-furyl group; a benzothiazole-4,7-diyl group substituted with a naphtho[1,2-b]furan-2-yl group; a 1H-isoindole-1,3(2H)-dione-4,7-diyl group substituted with a 5-methoxy-2-benzothiazolyl group; a 1H-isoindole-1,3(2H)-dione-4,7-diyl group substituted with a phenyl group; a 1H-isoindole-1,3(2H)-dione-4,7-diyl group substituted with a 4-nitrophenyl group; and a 1H isoindole-1,3(2H)-dione-4,7-diyl group substituted with a 2-thiazolyl group. Herein, $R^f$ and $R^{f1}$ each independently represent the same meanings as that of $Q^1$ described later. $R^g$ represents the same meaning as that of $A^y$ described later, and $R^h$ represents the same meaning as that of $A^x$ described later.

In the aforementioned formula (Ia), $Y^{1a}$ to $Y^{8a}$ each independently represent a chemical single bond, —O—, —S—, —O—C(=O)—, —C(=O)—O—, —O—C(=O)—O—, —NR$^{1a}$—C(=O)—, —C(=O)—NR$^{1a}$—, —O—C(=O)—NR$^{1a}$—, —NR$^{1a}$—C(=O)—O—, —NR$^{1a}$—C(=O)—NR$^{1a}$—, —O—NR$^{1a}$—, or —NR$^{1a}$—O—. Herein, $R^{1a}$ represents a hydrogen atom or an alkyl group of 1 to 6 carbon atoms.

In the aforementioned formula (Ia), $G^{1a}$ and $G^{2a}$ each independently represent a divalent aliphatic group of 1 to 20 carbon atoms optionally having a substituent. The aforementioned aliphatic group may contain one or more of —O—, —S—, —O—C(=O)—, —C(=O)—O—, —O—C(=O)—O—, —NR$^{2a}$—C(=O)—, —C(=O)—NR$^{2a}$—, —NR$^{2a}$—, and —C(=O)— per aliphatic group, which is interposed therein, with a proviso that the cases where two or more —O—'s or —S—'s are adjacently interposed are excluded. Herein, $R^{2a}$ represents a hydrogen atom or an alkyl group of 1 to 6 carbon atoms.

In the aforementioned formula (Ia), $Z^{1a}$ and $Z^{2a}$ each independently represent an alkenyl group of 2 to 10 carbon atoms optionally substituted with a halogen atom.

In the aforementioned formula (Ia), $A^{2a}$ and $A^{3a}$ each independently represent a divalent alicyclic hydrocarbon group of 3 to 30 carbon atoms optionally having a substituent.

In the aforementioned formula (Ia), $A^{4a}$ and $A^{5a}$ each independently represent a divalent aromatic group of 6 to 30 carbon atoms optionally having a substituent.

In the aforementioned formula (Ia), k and l each independently represent 0 or 1.

Particularly suitable specific examples of the reverse wavelength distribution liquid crystal compound may include a compound represented by the following formula (I).

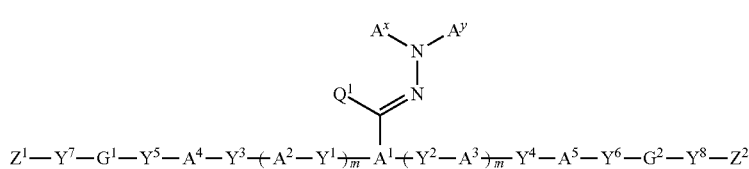

(I)

$Z^1—Y^7—G^1—Y^5—A^4—Y^3\!-\!\!\left(\!A^2—Y^1\!\right)_{\overline{m}}\!A^1\!\left(\!Y^2—A^3\!\right)_{\overline{m}}\!Y^4—A^5—Y^6—G^2—Y^8—Z^2$ In the aforementioned formula (I), $Y^1$ to $Y^8$ each independently represent a chemical single bond, —O—, —S—, —O—C(=O)—, —C(=O)—O—, —O—C(=O)—O—, —NR$^1$—C(=O)—, —C(=O)—NR$^1$—, —O—C(=O)—NR$^1$—, —NR$^1$—C(=O)—O—, —NR$^1$—C(=O)—NR$^1$—, —O—NR$^1$—, or —NR$^1$—O—. Herein, $R^1$ represents a hydrogen atom or an alkyl group of 1 to 6 carbon atoms.

In the aforementioned formula (I), $G^1$ and $G^2$ each independently represent a divalent aliphatic group of 1 to 20 carbon atoms optionally having a substituent. The aliphatic group may also contain one or more of —O—, —S—, —O—C(=O)—, —C(=O)—O—, —O—C(=O)—O—, —NR$^2$—C(=O)—, —C(=O)—NR$^2$—, —NR$^2$—, and —C(=O)— per aliphatic group, which is interposed therein, with a proviso that the cases where two or more —O—'s or —S—'s are adjacently interposed therein are excluded. Herein, $R^2$ represents a hydrogen atom or an alkyl group of 1 to 6 carbon atoms.

In the aforementioned formula (I), $Z^1$ and $Z^2$ each independently represent an alkenyl group of 2 to 10 carbon atoms optionally substituted with a halogen atom.

In the aforementioned formula (I), $A^x$ represents an organic group of 2 to 30 carbon atoms having at least one aromatic ring selected from the group consisting of an aromatic hydrocarbon ring and an aromatic heterocyclic ring. "Aromatic ring" means a cyclic structure having an aromatic property in a broad sense according to the Huckel law, that is, a cyclic conjugated structure having (4n+2) π electrons, and a cyclic structure in which a lone pair of electrons of a heteroatom such as sulfur, oxygen, nitrogen, or the like exhibits aromaticity by participating in a π electron system and which is represented by thiophene, furan, benzothiazole, or the like.

In the aforementioned formula (I), $A^y$ represents a hydrogen atom, an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, an alkynyl group of 2 to 20 carbon atoms optionally having a substituent, —C(=O)—R$^3$, —SO$_2$—R$^4$, —C(=S)NH—R$^9$, or an organic group of 2 to 30 carbon atoms having at least one aromatic ring selected from the group consisting of an aromatic hydrocarbon ring and an aromatic heterocyclic ring. Herein, $R^3$ represents an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, or an aromatic hydrocarbon ring group of 5 to 12 carbon atoms. $R^4$ represents an alkyl group of 1 to 20 carbon atoms, an alkenyl group of 2 to 20 carbon atoms, a phenyl group, or a 4-methylphenyl group. $R^9$ represents an alkyl group of 1 to 20 carbon atoms optionally having a substituent, an alkenyl group of 2 to 20 carbon atoms optionally having a substituent, a cycloalkyl group of 3 to 12 carbon atoms optionally having a substituent, or an aromatic group of 5 to 20 carbon atoms optionally having a substituent. The aromatic rings of the aforementioned $A^x$ and $A^y$ may have a substituent. The aforementioned $A^x$ and $A^y$ may together form a ring.

In the aforementioned formula (I), $A^1$ represents a trivalent aromatic group optionally having a substituent.

In the aforementioned formula (I), $A^2$ and $A^3$ each independently represent a divalent alicyclic hydrocarbon group of 3 to 30 carbon atoms optionally having a substituent.

In the aforementioned formula (I), $A^4$ and $A^5$ each independently represent a divalent aromatic group of 6 to 30 carbon atoms optionally having a substituent.

In the aforementioned formula (I), $Q^1$ represents a hydrogen atom or an alkyl group of 1 to 6 carbon atoms optionally having a substituent.

In the aforementioned formula (I), m's each independently represent 0 or 1.

Examples of the liquid crystal compound represented by the formula (I) may include compounds described in International Publication No. 2014/069515, International Publication No. 2015/064581, and the like.

The liquid crystal compound may be a forward wavelength distribution liquid crystal compound. Herein, the forward wavelength distribution liquid crystal compound refers to a liquid crystal compound which exhibits a forward wavelength distribution property when it is homogeneously oriented. By using a forward wavelength distribution liquid crystal compound as a part or all of the liquid crystal compound contained in the liquid crystal composition, a liquid crystal cured layer having a forward wavelength distribution property can be easily obtained.

Examples of the polymerizable forward wavelength dispersible liquid crystal compound may include a compound represented by the following formula (II).

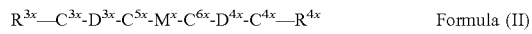

$R^{3x}—C^{3x}-D^{3x}-C^{5x}-M^x-C^{6x}-D^{4x}-C^{4x}—R^{4x}$  Formula (II)

In the formula (II), $R^{3x}$ and $R^{4x}$ each independently represents a reactive group. Examples of $R^{3x}$ and $R^{4x}$ may include a (meth)acryloyl group, an epoxy group, a thioepoxy group, an oxetane group, a thietanyl group, an aziridinyl group, a pyrrole group, a fumarate group, a cinnamoyl group, an isocyanate group, an isothiocyanate group, an amino group, a hydroxyl group, a carboxyl group, an alkoxysilyl group, an oxazoline group, a mercapto group, a vinyl group, and an allyl group.

In the formula (II), $D^{3x}$ and $D^{4x}$ each independently represent a group selected from the group consisting of a single bond, a linear or branched alkylene group of 1 to 20 carbon atoms, and a linear or branched alkylene oxide group of 1 to 20 carbon atoms.

In the formula (II), $C^{3x}$ to $C^{6x}$ each independently represents a group selected from the group consisting of a single bond, —O—, —S—, —S—S—, —CO—, —CS—, —OCO—, —CH$_2$—, —OCH$_2$—, —CH=N—N=CH—, —NHCO—, —OCOO—, —CH$_2$COO—, and —CH$_2$OCO—.

In the formula (II), $M^x$ represents a mesogen group. Suitable mesogen groups $M^x$ may be formed by bonding two to four skeletons selected from the group consisting of azomethines, azoxies, phenyls, biphenyls, terphenyls, naphthalenes, anthracenes, benzoic acid esters, cyclohexane carboxylic acid phenylesters, cyanophenylcyclohexanes, cyano-substituted phenylpyrimidines, alkoxy-substituted phenylpyrimidines, phenyldioxanes, tolanes, and alkenylcyclohexylbenzonitriles, which may optionally have a substituent, with a bonding group such as —O—, —S—, —S—S—, —CO—, —CS—, —OCO—, —CH$_2$—, —OCH$_2$—, —CH=N—N=CH—, —NHCO—, —OCOO—, —CH$_2$COO—, and —CH$_2$OCO—.

Examples of the substituent that may be included in the mesogen group $M^x$ may include a halogen atom, an alkyl group of 1 to 10 carbon atoms optionally having a substituent, a cyano group, a nitro group, —O—R$^{5x}$, —O—C(=O)—R$^{5x}$, —C(=O)—O—R$^{5x}$, —O—C(=O)—O—R$^{5x}$, —NR$^{5x}$—C(=O)—R$^{5x}$, —C(=O)—NR$^{5x}$R$^{7x}$, and —O—C(=O)—NR$^{5x}$R$^{7x}$. Herein, R$^{5x}$ and R$^{7x}$ represent a hydrogen atom or an alkyl group of 1 to 10 carbon atoms. When R$^{5x}$ and R$^{7x}$ are an alkyl group, the alkyl group may contain —O—, —S—, —O—C(=O)—, —C(=O)—O—, —O—C(=O)—O—, —NR$^{6x}$—C(=O)—, —C(=O)—NR$^{6x}$—, —NR$^{6x}$—, or —C(=O)—, which is interposed therein (with a proviso that the cases wherein two or more —O—'s and —S—'s are adjacently interposed therein are excluded). Herein, R$^{6x}$ represents a hydrogen atom or an alkyl group of 1 to 6 carbon atoms.

Examples of the substituent in the aforementioned "alkyl group of 1 to 10 carbon atoms optionally having a substituent" may include a halogen atom, a hydroxyl group, a carboxyl group, a cyano group, an amino group, an alkoxy group of 1 to 6 carbon atoms, an alkoxyalkoxy group of 2 to 8 carbon atoms, an alkoxyalkoxyalkoxy group of 3 to 15 carbon atoms, an alkoxycarbonyl group of 2 to 7 carbon atoms, an alkylcarbonyloxy group of 2 to 7 carbon atoms, and an alkoxycarbonyloxy group of 2 to 7 carbon atoms.

Examples of the liquid crystal compound represented by the formula (II) may include rod-shaped liquid crystal compounds described in International Publication No. 2016/002765, and the like.

As the liquid crystal compound, one type thereof may be solely used, and two or more types thereof may also be used in combination at any ratio.

The amount of the liquid crystal compound in the liquid crystal composition may be optionally set within a range in which a desired liquid crystal cured layer can be obtained, and is preferably 1% by weight or more, more preferably 5% by weight or more, and particularly preferably 10% by weight or more, and is preferably 100% by weight or less, more preferably 80% by weight or less, and particularly preferably 60% by weight or less.

The liquid crystal composition may contain an optional component in combination with the liquid crystal compound. Examples of the optional component may include a polymerization initiator, a surfactant, a solvent, a metal, a metal complex, a dye, a pigment, a fluorescent material, a phosphorescent material, a leveling agent, a thixotropic agent, a gelling agent, a polysaccharide, an infrared absorber, an antioxidant, an ion exchange resin, and a metal oxide such as titanium oxide. For optional components, reference may be made to International Publication No. 2015/064581.

The liquid crystal cured layer is a layer formed of a cured product of the above-described liquid crystal composition containing a liquid crystal compound, and usually contains cured liquid crystal molecules obtained from the liquid crystal compound. The "cured liquid crystal molecules" herein mean molecules of a compound obtained by solidification of a compound capable of exhibiting a liquid crystal phase, the solidification being achieved while keeping a state wherein the compound is exhibiting the liquid crystal phase. The cured liquid crystal molecules contained in the liquid crystal cured layer are usually polymers formed by polymerization of the liquid crystal compound. Therefore, the liquid crystal cured layer is usually a resin layer that contains a polymer obtained by the polymerization of the liquid crystal compound and, if necessary, may contain an optional component. Such a liquid crystal cured layer may have an optical anisotropy in accordance with the orientation state of the cured liquid crystal molecules. The optical anisotropy of the liquid crystal cured layer may be expressed as an in-plane retardation. The specific in-plane retardation of the liquid crystal cured layer may be set in accordance with the in-plane retardation that the optically anisotropic layer is expected to have.

From the viewpoint of effectively suppressing a change in the optical properties of the liquid crystal cured layer due to ultraviolet light, it is preferable that the liquid crystal cured layer is a layer that does not have tendency to absorb ultraviolet light. Therefore, it is preferable that the liquid crystal cured layer has a high ultraviolet transmittance. In particular, when the liquid crystal cured layer has a high light transmittance at a wavelength of 390 nm the transmittance thereof being blocked by the substrate layer, a change in the optical properties of the liquid crystal cured layer can be particularly effectively suppressed. From such a viewpoint, the light transmittance of the liquid crystal cured layer at a wavelength of 390 nm is preferably 70% or more, more preferably 80% or more, and particularly preferably 85% or more. Such a liquid crystal cured layer having a high light transmittance at a wavelength of 390 nm can be achieved by, for example, using a forward wavelength distribution liquid crystal compound.

It is preferable that the liquid crystal cured layer has a high light transmittance at a visible wavelength from the viewpoint of allowing the optical layered body to stably exert a function as an optical member. For example, the light transmittance of the liquid crystal cured layer in the wavelength range of 400 nm to 700 nm is preferably 85% to 100%, more preferably 87% to 100%, and particularly preferably 90% to 100%.

It is preferable that the liquid crystal cured layer has a small haze from the viewpoint of enhancing the image sharpness of the image display device incorporating the optical layered body. The haze of the liquid crystal cured layer is preferably 1% or less, more preferably 0.8% or less, and particularly preferably 0.5% or less.

The thickness of the liquid crystal cured layer may be appropriately adjusted so that optical properties such as retardation can be set in a desired range, and is preferably 0.5 μm or more, and more preferably 1.0 μm or more, and is preferably 10 μm or less, more preferably 7 μm or less, and particularly preferably 5 μm or less.

The liquid crystal cured layer may be produced by a production method that usually includes a step of forming a layer of a liquid crystal composition on a coating-subject substrate, and a step of curing the layer of the liquid crystal composition to obtain a liquid crystal cured layer.

In this production method, a coating-subject substrate is prepared, and a layer of a liquid crystal composition is formed on the surface of the coating-subject substrate. As the coating-subject substrate, a resin film is usually used. As the resin, a thermoplastic resin may be used. Of these, a resin containing an alicyclic structure-containing polymer and a cellulose ester resin are preferable from the viewpoints of transparency, low hygroscopicity, size stability, and light-weight property.

The surface of the coating-subject substrate may be subjected to a treatment for imparting an orientation regulating force thereto in order to promote orientation of the liquid crystal compound in the layer of the liquid crystal composition. Herein, the orientation regulating force of a certain surface refers to a property of the surface capable of orienting the liquid crystal compound in the liquid crystal composition.

Examples of the treatment for imparting the orientation regulating force may include a rubbing treatment, an orientation layer forming treatment, an ion beam orientation treatment, a stretching treatment, and the like, and of these, a stretching treatment is preferable. The molecules of the polymer contained in the coating-subject substrate can be oriented by subjecting the coating-subject substrate to a stretching treatment under appropriate conditions. Thereby, an orientation regulating force for orienting the liquid crystal compound in the orientation direction of the molecules of the polymer contained in the coating-subject substrate can be imparted to the surface of the coating-subject substrate.

The stretching of the coating-subject substrate is preferably performed so as to impart anisotropy to the coating-subject substrate so that a slow axis is developed in the coating-subject substrate. By such a stretching, an orientation regulating force for orienting the liquid crystal compound in a direction parallel to or perpendicular to the slow axis of the coating-subject substrate is usually imparted to the surface of the coating-subject substrate. For example, when a resin having a positive intrinsic birefringence value is used as a material of the coating-subject substrate, a slow axis parallel to the stretching direction is usually developed by giving orientation in the stretching direction to molecules of a polymer contained in the coating-subject substrate, and thereby an orientation regulating force for giving orientation to the liquid crystal compound in a direction parallel to the slow axis of the coating-subject substrate is imparted to the surface of the coating-subject substrate. Therefore, the stretching direction of the coating-subject substrate may be set in accordance with a desired orientation direction in which the liquid crystal compound is to be oriented.

The stretching ratio may be set so that the birefringence $\Delta n$ of the coating-subject substrate after stretching falls within a desired range. The birefringence $\Delta n$ of the coating-subject substrate after being stretched is preferably 0.000050 or more, and more preferably 0.000070 or more, and is preferably 0.007500 or less, and more preferably 0.007000 or less. When the birefringence $\Delta n$ of the coating-subject substrate after being stretched is equal to or greater than the lower limit value of the aforementioned range, it is possible to impart a good orientation regulating force to the surface of the coating-subject substrate. The stretching may be performed using a stretching machine such as a tenter stretching machine.

As the coating-subject substrate, it is preferable to use a long-length film. By using a long-length film as the coating-subject substrate, productivity of the liquid crystal cured layer can be improved. In this case, the thickness of the coating-subject substrate is preferably 1 µm or more, more preferably 5 µm or more, and particularly preferably 30 µm or more, and is preferably 1000 µm or less, more preferably 300 µm or less, and particularly preferably 100 µm or less, from the viewpoint of facilitating productivity improvement, thickness reduction, and weight reduction.

The layer of the liquid crystal composition is usually formed by a coating method. Specifically, the liquid crystal composition is applied onto the surface of the coating-subject substrate to form a layer of the liquid crystal composition. Examples of the coating methods may include a curtain coating method, an extrusion coating method, a roll coating method, a spin coating method, a dip coating method, a bar coating method, a spray coating method, a slide coating method, a print coating method, a gravure coating method, a die coating method, a gap coating method, and a dipping method. The thickness of the layer of the liquid crystal composition to be coated may be appropriately set in accordance with a desired thickness required for the liquid crystal cured layer.

After the layer of the liquid crystal composition is formed, if necessary, a step of drying the layer of the liquid crystal composition may be performed. Such drying may be achieved by a drying method such as natural drying, heating drying, vacuum drying, vacuum heating drying, or the like. By performing such drying, the solvent can be removed from the layer of liquid crystal composition.

After the layer of the liquid crystal composition is formed, if necessary, a step of giving orientation to the liquid crystal compound contained in the layer may be performed. Usually in this step, the layer of the liquid crystal composition is subjected to an orientation treatment, to thereby giving orientation to the liquid crystal compound in a direction corresponding to the orientation regulating force of the surface of the coating-subject substrate. The orientation treatment is usually performed by heating a layer of the liquid crystal composition to a specific orientation temperature. The conditions for this orientation treatment may be appropriately set in accordance with the properties of the liquid crystal composition used. As a specific example of the conditions of the orientation treatment, the conditions of the treatment at a temperature of 50° C. to 160° C. for 30 seconds to 5 minutes may be used.

However, the orientation of the liquid crystal compound may be immediately achieved by coating with the liquid crystal composition. Therefore, even when it is desired to orient the liquid crystal compound, the orientation treatment to the layer of the liquid crystal composition is not necessarily performed.

After optionally performing the drying of the layer of the liquid crystal composition and orientation of the liquid crystal compound, a step of curing the layer of the liquid crystal composition to obtain a liquid crystal cured layer is performed. In this step, the liquid crystal compound is usually polymerized to cure the layer of the liquid crystal composition. As the method for polymerizing the liquid crystal compound, a method that suits the properties of the components included in the liquid crystal composition may be selected. Examples of the polymerization method may include a method of irradiation with active energy rays and a thermal polymerization method. Of these, since heating is unnecessary and the polymerization reaction is allowed to proceed at room temperature, a method of irradiation with active energy rays is preferable. Herein, the active energy rays for the irradiation may include light such as visible light, ultraviolet light, and infrared light, and any energy rays such as an electron beam.

Of these, a method of irradiation with light such as ultraviolet light is preferable because the operation is simple. The temperature at the time of ultraviolet irradiation is preferably set to be equal to or lower than the glass transition temperature of the coating-subject substrate. The temperature is preferably 150° C. or lower, more preferably 100° C. or lower, and particularly preferably 80° C. or lower. The lower limit of the temperature at the time of ultraviolet irradiation may be 15° C. or higher. The ultraviolet irradiation intensity is preferably 0.1 mW/cm$^2$ or more, and more preferably 0.5 mW/cm$^2$ or more, and is preferably 1000 mW/cm$^2$ or less, and more preferably 600 mW/cm$^2$ or less.

[3.2. Optional Layer that the Optically Anisotropic Layer May Contain]

The optically anisotropic layer may contain an optional layer in combination with the liquid crystal cured layer.

For example, the optically anisotropic layer may contain a phase difference film layer as an optional layer. The phase difference film layer is a layer having an optical anisotropy formed of a material other than a liquid crystal cured material, and usually has a specific in-plane retardation. By using the phase difference film layer in combination with the liquid crystal cured layer, the optical properties of the optically anisotropic layer can be prepared in a wide range.

As the phase difference film layer, a stretched film formed of a resin is usually used. The stretched film is a film obtained by subjecting a resin film to a stretching treatment, and the polymer in the film is oriented by the above-mentioned stretching treatment. Consequently, the stretched film can have an optical anisotropy corresponding to the orientation of the polymer.

As the resin for forming the phase difference film layer, a resin containing a polymer and, if necessary, an optional component other than the polymer may be used.

As the polymer, for example, any polymer selected from the range described as the polymer contained in the resin of the substrate layer may be used. The amount of the polymer in the resin of the phase difference film layer is preferably 90.0% by weight to 100% by weight, and more preferably 95.0% by weight to 100% by weight. By setting the amount of the polymer in the aforementioned range, heat and moisture resistance and mechanical strength of the phase difference film layer can be effectively increased.

Examples of the optional components may include components that are the same as those listed as optional components that may be contained in the resin of the substrate layer. As these components, one type thereof may be solely used, and two or more types thereof may also be used in combination at any ratio.

The thickness of the phase difference film layer is preferably 10 μm or more, more preferably 13 μm or more, and particularly preferably 15 μm or more, and is preferably 60 μm or less, more preferably 58 μm or less, and particularly preferably 55 μm or less. When the thickness of the phase difference film layer is equal to or more than the lower limit value of the aforementioned range, desired retardation can be exhibited, and when it is equal to or less than the upper limit value of the aforementioned range, thickness reduction can be achieved.

Further, the optically anisotropic layer may contain a tacky layer, an adhesive layer, or the like as an optional layer.

[3.3. Optical Properties of Optically Anisotropic Layer]

The optically anisotropic layer is a layer having optical properties suitable for the use application of the optical layered body. Thus, the optically anisotropic layer may have any optical properties suitable for the use application of the optical layered body.

For example, the optically anisotropic layer may be a layer functioning as a λ/2 plate. Herein, the layer functioning as the λ/2 plate refers to a layer having an in-plane retardation in a specific range at a wavelength of 550 nm. Specifically, the in-plane retardation at a wavelength of 550 nm of the layer functioning as the λ/2 plate is preferably 240 nm or more, and more preferably 250 nm or more, and is more preferably 300 nm or less, more preferably 280 nm or less, and particularly preferably 265 nm or less.

As described above, the optically anisotropic layer functioning as the λ/2 plate may be realized, for example, as a layer containing only the liquid crystal cured layer functioning as the λ/2 plate.

The optically anisotropic layer may be a layer functioning as a λ/4 plate. Herein, the layer functioning as the λ/4 plate refers to a layer having an in-plane retardation in a specific range at a wavelength of 550 nm. Specifically, the in-plane retardation at a wavelength of 550 nm of the layer functioning as the λ/4 plate is preferably 110 nm or more, more preferably 120 nm or more, and particularly preferably 125 nm or more, and is preferably 165 nm or less, more preferably 155 nm or less, and particularly preferably 150 nm or less. The optical layered body functioning as the λ/4 plate may be combined with a linear polarizer to obtain a circular polarizing plate.

As described above, the optically anisotropic layer functioning as the λ/4 plate may be realized, for example, as a layer containing only the liquid crystal cured layer functioning as the λ/4 plate.

It is particularly preferable that the optically anisotropic layer functioning as the λ/4 plate is a layer functioning as a broadband λ/4 plate. Herein, the layer functioning as the broadband λ/4 plate refers to a layer functioning as the λ/4 plate and exhibiting a reverse wavelength distribution property. The layer functioning as the broadband λ/4 plate can function as the λ/4 plate in a wide wavelength range. Therefore in particular, when the optical layered body is provided in the image display device, unintentional coloration of the image observed from the front direction can be suppressed. In addition, by combining the optical layered body including the optically anisotropic layer functioning as the broadband λ/4 plate with a linear polarizer, a circular polarizing plate functioning in a wide wavelength range can be realized.

The optically anisotropic layer functioning as the broadband λ/4 plate as described above can be realized, for example, as a layer containing only the liquid crystal cured layer functioning as the λ/4 plate produced using the reverse wavelength distribution liquid crystal compound.

The optically anisotropic layer functioning as the broadband λ/4 plate can be realized as a layer having a multilayer structure containing, for example, a liquid crystal cured layer functioning as one of the λ/4 plate and the λ/2 plate, and a layer functioning as the other of the λ/4 plate and the λ/2 plate. As a specific example, a liquid crystal cured layer functioning as a λ/4 plate and a liquid crystal cured layer functioning as a λ/2 plate may be combined to realize an optically anisotropic layer functioning as a broadband λ/4 plate. Further, for example, a liquid crystal cured layer functioning as a λ/4 plate and a phase difference film layer functioning as a λ/2 plate may be combined to realize an optically anisotropic layer functioning as a broadband λ/4 plate. Further, for example, a phase difference film layer functioning as a λ/4 plate and a liquid crystal cured layer functioning as a λ/2 plate may be combined to realize an optically anisotropic layer functioning as a broadband λ/4 plate.

Generally, when a multilayer film that is a combination of a λ/4 plate having a slow axis forming an angle $\theta_{\lambda/4}$ with respect to a certain reference direction and a λ/2 plate having a slow axis forming an angle $\theta_{\lambda/2}$ with respect to the reference direction satisfies the formula (X): "$\theta_{\lambda/4}=2\theta_{\lambda/2}+45°$", the multilayer film becomes a broadband λ/4 plate capable of giving an in-plane retardation of approximately ¼ wavelength of the wavelength of the light to the light in the front direction passing through the multilayer film in a wide wavelength range (see Japanese Patent Application Laid-Open No. 2007-004120 A). Therefore, from the viewpoint of obtaining an optically anisotropic layer functioning as a broadband λ/4 plate by the combination of the liquid crystal cured layer functioning as one of the λ/4 plate and the λ/2 plate and the layer functioning as the other of the λ/4 plate and the λ/2 plate, it is preferable to satisfy a relationship close to that expressed by the aforementioned formula (X) between the slow axis of the liquid crystal cured layer functioning as one of the λ/4 plate and the λ/2 plate and the slow axis of the layer functioning as the other of the λ/4 plate and the λ/2 plate. From this viewpoint, the intersection angle formed by the slow axis of the liquid crystal cured layer functioning as one of the λ/4 plate and the λ/2 plate and the slow axis of the layer functioning as the other of the λ/4 plate and the λ/2 plate is preferably 550 or more, more preferably 570 or more, and particularly preferably 590 or more, and is preferably 650 or less, more preferably 630 or less, and particularly preferably 610 or less.

When the optical layered body is a long-length film, it is preferable that the relationship between the slow axis of the liquid crystal cured layer functioning as one of the λ/4 plate and the λ/2 plate and the slow axis of the layer functioning as the other of the λ/4 plate and the λ/2 plate satisfies any of the following relationships (X1), (X2), and (X3) from the viewpoint of making it possible to produce a circular polarizing plate by bonding of the optical layered body with a long-length linear polarizer using a roll-to-roll method.

(X1) The orientation angle formed by the slow axis of the liquid crystal cured layer functioning as one of the λ/4 plate and the λ/2 plate with respect to the width direction of the optical layered body is preferably 75°±5°, more preferably 75°±3°, and particularly preferably 75°±1°, and the orientation angle formed by the slow axis of the layer functioning as the other of the λ/4 plate and the λ/2 plate with respect to the width direction of the optical layered body is preferably 15°±5°, more preferably 15°±3°, and particularly preferably 15°±1°.

(X2) The orientation angle formed by the slow axis of the liquid crystal cured layer functioning as one of the λ/4 plate and the λ/2 plate with respect to the width direction of the optical layered body is preferably 15°±5°, more preferably 15°±3°, and particularly preferably 15°±1°, and the orientation angle formed by the slow axis of the layer functioning as the other of the λ/4 plate and the λ/2 plate with respect to the width direction of the optical layered body is preferably 75°±5°, more preferably 75°±3°, and particularly preferably 75°±1°.

(X3) The orientation angle formed by the slow axis of the liquid crystal cured layer functioning as one of the λ/4 plate and the λ/2 plate with respect to the width direction of the optical layered body is preferably 22.5°±5°, more preferably 22.5°±3°, and particularly preferably 22.5°±1°, and the orientation angle formed by the slow axis of the layer functioning as the other of the λ/4 plate and the λ/2 plate with respect to the width direction of the optical layered body is preferably 90°±5°, more preferably 90°±3°, and particularly preferably 90°±1°.

Generally, a long-length linear polarizer has a polarized light transmission axis in its width direction. Therefore, when any one of the relationships (X1), (X2) and (X3) is satisfied, a circular polarizing plate is obtainable by bonding the λ/2 plate of the optical layered body and the linear polarizer to each other with their lengthwise directions being parallel to each other. Consequently, a circular polarizing plate can be produced by a roll-to-roll method.

Herein, the direction in which the slow axis of the liquid crystal cured layer functioning as one of the λ/4 plate and the λ/2 plate forms the orientation angle with respect to the width direction of the optical layered body is generally the same as the direction in which the slow axis of the layer functioning as the other of the λ/4 plate and the λ/2 plate forms the orientation angle with respect to the width direction of the optical layered body. Therefore, for example, when the slow axis of the liquid crystal cured layer functioning as one of the λ/4 plate and the λ/2 plate forms the orientation angle in the clockwise direction with respect to the width direction of the optical layered body when viewed from the thickness direction, the slow axis of the layer functioning as the other of the λ/4 plate and the λ/2 plate usually forms the orientation angle in the clockwise direction with respect to the width direction of the optical layered body.

It is preferable that the optically anisotropic layer has a high light transmittance at a visible wavelength from the viewpoint of stably allowing the optical layered body to exhibit a function as an optical member. For example, the light transmittance of the optically anisotropic layer in the wavelength range of 400 nm to 700 nm is preferably 85% to 100%, more preferably 87% to 100%, and particularly preferably 90% to 100%.

It is preferable that the optically anisotropic layer has a small haze from the viewpoint of enhancing the image sharpness of the image display device incorporating the optical layered body. The haze of the optically anisotropic layer is preferably 1% or less, more preferably 0.8% or less, and particularly preferably 0.5% or less.

The thickness of the optically anisotropic layer may be appropriately adjusted so that the optical properties such as a retardation falls within a desired range, and is preferably 0.5 µm or more, more preferably 1.0 µm or more, and particularly preferably 1.2 µm or more, and is preferably 100 µm or less, more preferably 80 µm or less, and particularly preferably 60 µm or less.

[3.4. Method for Producing Optically Anisotropic Layer]

The method for producing the optically anisotropic layer may be any method. For example, an optically anisotropic layer consisting only of a single liquid crystal cured layer may be produced by producing a liquid crystal cured layer on a coating-subject substrate using a liquid crystal composition in the above-described manner, and then peeling off the coating-subject substrate if necessary. In addition, for example, an optically anisotropic layer containing a liquid crystal cured layer and an optional layer may be produced by preparing a liquid crystal cured layer and an optional layer, and then bonding the liquid crystal cured layer and the optional layer using a tackiness agent or an adhesive agent if necessary.

[4. Optional Layer that the Optical Layered Body May Contain]

The optical layered body may further contain an optional layer in addition to the above-described substrate layer and optically anisotropic layer.

The optional layer may be an electroconductive layer. An optical layered body including such an electroconductive layer may be used as a film sensor member. When such an optical layered body is provided as a film sensor member in a touch panel or an image display device, the electroconductive layer may function as a circuit member such as an electrode or a wiring of a touch panel.

The electroconductive layer is usually provided on one or both surfaces of the substrate layer. In this case, when the substrate layer is formed of a resin, the substrate layer is less prone to be broken than a glass substrate. Therefore, the optical layered body having an electroconductive layer may be used as a film sensor member having excellent mechanical durability. Further, the substrate layer formed of a resin generally has excellent flexibility. Therefore, when the optical layered body having an electroconductive layer is used as a film sensor member, a touch panel allowing smooth input with a finger can be accomplished. In particular, when the substrate layer formed of a resin containing a polymer containing an alicyclic structure is used, it is possible to take advantage of excellent heat resistance and low moisture absorbency of the polymer, and thereby a film sensor member which is less prone to cause deformation such as curling in a high temperature or high humidity environment can be obtained. More particularly, when a resin having a high glass transition temperature is used, the above-described advantage can be more effectively obtained.

The electroconductive layer may be, for example, a layer containing at least one electroconductive material selected from the group consisting of an electroconductive metal oxide, an electroconductive nanowire, a metallic mesh, and an electroconductive polymer.

Examples of the electroconductive metal oxide may include ITO (indium tin oxide), IZO (indium zinc oxide), ZnO (zinc oxide), IWO (indium tungsten oxide), ITiO (indium titanium oxide), AZO (aluminum zinc oxide), GZO (gallium zinc oxide), XZO (zinc-based special oxide), and IGZO (indium gallium zinc oxide). Of these, ITO is particularly preferable from the viewpoint of light transmittance and durability. As these electroconductive metal oxides, one type thereof may be solely used, and two or more types thereof may also be used in combination at any ratio.

The electroconductive layer containing an electroconductive metal oxide may be formed by a film forming method such as a vapor deposition method, a sputtering method, an ion plating method, an ion beam assisted vapor deposition method, an arc discharge plasma vapor deposition method, a thermal CVD method, a plasm CVD method, a plating method, or a combination of two or more of them. Of these, a vapor deposition method and a sputtering method are preferable, and a sputtering method is particularly preferable. By the sputtering method, an electroconductive layer having a uniform thickness can be formed, and accordingly occurrence of locally thin portion of the electroconductive layer can be suppressed.

The electroconductive nanowire refers to an electroconductive material in a needle shape or a thread shape having a nanometer-size diameter. The electroconductive nanowire may be linear or curved. Such electroconductive nanowires form a network having gaps between the electroconductive nanowires, and therefore an excellent electrical conductive path can be formed even when the amount of the electroconductive nanowires is small so that an electroconductive layer having a low electric resistance can be achieved. Further, as the electroconductive nanowires form the network, openings are formed at gaps of the network. Accordingly, an electroconductive layer having a high light transmittance can be obtained. Further, when the electroconductive layer containing electroconductive nanowires is used, an optical layered body having excellent bend resistance can usually be obtained.

The ratio of the length L relative to the thickness d (aspect ratio: L/d) of the electroconductive nanowires is preferably 10 to 100,000, more preferably 50 to 100,000, and particularly preferably 100 to 10,000. When the electroconductive nanowires having such a high aspect ratio are used, the electroconductive nanowires favorably intersect with each other so that high conductivity can be achieved even when the amount of the electroconductive nanowires is small. As a result, an optical layered body having excellent transparency can be obtained. The "thickness of the electroconductive nanowires" herein means the diameter of the electroconductive nanowires when the electroconductive nanowires have a circular cross-section, and means the length of the minor axis of the electroconductive nanowires when the electroconductive nanowires have an elliptical shape, and means the length of the longest diagonal line of the electroconductive nanowires when the electroconductive nanowires have a polygonal shape. The thickness and length of the electroconductive nanowires may be measured with a scanning electronic microscope or a transmission electron microscope.

The thickness of the electroconductive nanowires is preferably less than 500 nm, more preferably less than 200 nm, even more preferably 10 nm to 100 nm, and particularly preferably 10 nm to 50 nm. By having such a thickness, transparency of the electroconductive layer can be enhanced.

The length of the electroconductive nanowires is preferably 2.5 µm to 1000 µm, more preferably 10 µm to 500 µm, and particularly preferably 20 µm to 100 µm. By having such a length, electrical conductivity of the electroconductive layer can be enhanced.

Examples of the electroconductive nanowires may include metal nanowires formed of a metal and electroconductive nanowires containing carbon nanotubes.

The electroconductive nanowire content of the electroconductive layer is preferably 80% by weight to 100% by weight, more preferably 85% by weight to 99% by weight, relative to the total weight of the electroconductive layer. By having such a content, an electroconductive layer having excellent electrical conductivity and light transmittance can be obtained.

The electroconductive layer containing electroconductive nanowires may be produced by applying and drying an electroconductive nanowire dispersion that has been obtained by dispersing electroconductive nanowires in a solvent.

The metallic mesh is formed from metal thin wires so as to have a grid pattern. The metal contained in the metallic mesh is preferably a highly electroconductive metal. Preferable examples of such a metal may include gold, platinum, silver, and copper. Of these, silver, copper, and gold are preferable, and silver is more preferable. As these metals, one type thereof may be solely used, and two or more types thereof may also be used in combination at any ratio.

The electroconductive layer containing a metallic mesh may be formed by, for example, applying a silver salt-containing composition for forming an electroconductive layer, and then performing exposure treatment and development treatment to thereby form metal thin wires having a specific grid pattern. Alternatively, the electroconductive layer containing a metallic mesh may be formed also by printing a specific pattern of a metal fine particle-containing composition for forming an electroconductive layer. As to the details of such an electroconductive layer and a method for forming the same, reference may be made to Japanese Patent Application Laid-Open No. 2012-18634 A and Japanese Patent Application Laid-Open No. 2003-331654 A.

Examples of the electroconductive polymer may include a polythiophene-based polymer, a polyacetylene-based polymer, a polyparaphenylene-based polymer, a polyaniline-based polymer, a polyparaphenylene vinylene-based polymer, a polypyrrole-based polymer, a polyphenylene-based polymer, and a polyester-based polymer modified with an acrylic-based polymer. Of these, a polythiophene-based polymer, a polyacetylene-based polymer, a polyparaphenylene-based polymer, a polyaniline-based polymer, a polyparaphenylene vinylene-based polymer, and a polypyrrole-based polymer are preferable. Of these, a polythiophene-based polymer is particularly preferable. By using a polythiophene-based polymer, an electroconductive layer having excellent transparency and chemical stability can be obtained. Examples of the polythiophene-based polymers may include polythiophene, poly(3-$C_{1-8}$ alkyl-thiophene) such as poly(3-hexylthiophene); poly(3,4-(cyclo)alkylenedioxythiophene) such as poly(3,4-ethylenedioxythiophene), poly(3,4-propylenedioxythiophene), and poly(3,4-(1,2-cyclohexylene)dioxythiophene); and polythienylenevinylene.

As these electroconductive polymers, one type thereof may be solely used, and two or more types thereof may also be used in combination at any ratio.

The electroconductive layer containing the electroconductive polymer may be formed by, for example, coating and drying an electroconductive composition containing the electroconductive polymer. For an electroconductive layer containing an electroconductive polymer, reference may be made to Japanese Patent Application Laid-Open No. 2011-175601 A.

The electroconductive layer may be entirely formed in the in-plane direction of the optical layered body or may be patterned to have a specific pattern. The pattern of the electroconductive layer is preferably one that favorably operates as a touch panel (e.g., an electrostatic capacitive touch panel). Examples of such a pattern may include those described in Japanese Translation of PCT Patent Application Publication No. 2011-511357 A, Japanese Patent Application Laid-Open No. 2010-164938 A, Japanese Patent Application Laid-Open No. 2008-310550 A, Japanese Translation of PCT Patent Application Publication No. 2003-511799 A, and Japanese Translation of PCT Patent Application Publication No. 2010-541109 A.

The surface resistance value of the electroconductive layer is preferably 2000 Ω/square or less, more preferably 1500 Ω/square or less, and particularly preferably 1000 Ω/square or less. With such a low surface resistance of the electroconductive layer, a high-performance touch panel can be realized using the optical layered body as a film sensor member. Although there is no particular limitation as to the lower limit of the surface resistance value of the electroconductive layer, it is preferably 100 Ω/square or more, more preferably 200 Ω/square or more, and particularly preferably 300 Ω/square or more, because of facilitation of the production.

The light transmittance of the electroconductive layer in the wavelength range of 400 nm to 700 nm is preferably 85% or more, more preferably 90% or more, and still more preferably 95% or more.

The thickness of the electroconductive layer is preferably 0.01 μm to 10 μm, more preferably 0.05 μm to 3 μm, and particularly preferably 0.1 μm to 1 μm.

Examples of the optional layers that the optical layered body may have may include a tacky layer, and an adhesive layer.

[5. Properties and Size of Optical Layered Body]

Since the optical layered body includes the substrate layer that blocks the transmission of ultraviolet light, the optical layered body has high resistance to ultraviolet light. Therefore, even when the optical layered body is irradiated with light containing ultraviolet light, a change in the in-plane retardation of the optical layered body is small. In particular, a change in the in-plane retardation of the above-described optical layered body can be made small in a wide visible wavelength range. Thus, reduction in the display performance of an image display device including the optical layered body due to ultraviolet light can be suppressed. For example, it is possible to suppress unintentional coloration of images due to UV-caused deterioration can be suppressed.

Specifically, the in-plane retardation Re0(450) at the wavelength 450 nm before the optical layered body is exposed to a xenon lamp, the in-plane retardation Re0(550) at the wavelength 550 nm before the optical layered body is exposed to the xenon lamp, the in-plane retardation Re300 (450) at the wavelength 450 nm after the optical layered body was exposed to the xenon lamp for 300 hours, and the in-plane retardation Re300(550) at the wavelength 550 nm after the optical layered body was exposed to the xenon lamp for 300 hours satisfy the following equations (1) and (2).

$$0.95 \leq Re300(450)/Re0(450) \leq 1.05 \tag{1},$$

$$0.95 \leq Re300(550)/Re0(550) \leq 1.05 \tag{2}.$$

Referring to the formula (1) in more detail, Re300(450)/Re0(450) is usually 0.95 or more, preferably 0.96 or more, and more preferably 0.97 or more, and is usually 1.05 or less, preferably 1.04 or less, and more preferably 1.03 or less.

Also, referring to the formula (2) in more detail, Re300(550)/Re0(550) is usually 0.95 or more, preferably 0.96 or more, and more preferably 0.97 or more, and is usually 1.05 or less, preferably 1.04 or less, and more preferably 1.03 or less.

Further, it is preferable that the in-plane retardation Re0(650) at a wavelength of 650 nm before the optical layered body is exposed to the xenon lamp and the in-plane retardation Re300(650) at the wavelength of 650 nm after the optical layered body was exposed to the xenon lamp for 300 hours satisfy the following formula (3).

$$0.95 \leq Re300(650)/Re0(650) \leq 1.05 \tag{3}.$$

Referring to the formula (3) in more detail, Re300(650)/Re0(650) is preferably 0.95 or more, more preferably 0.96 or more, and particularly preferably 0.97 or more, and is preferably 1.05 or more, more preferably 1.04 or more, and particularly preferably 1.03 or more.

Herein, the aforementioned exposure to xenon lamp means the irradiation with light from a xenon lamp onto the surface of the optical layered body on the side of the substrate layer. As the xenon lamp, a xenon lamp having a spectral irradiance of 0.8 W/m²/nm at wavelength of 420 nm and an accumulated irradiance of 48 W/m² in wavelength of 300 nm to 400 nm is used.

In addition, since the optical layered body has high resistance to ultraviolet light, it is possible to suppress a change in the degree of wavelength distribution property of the optical layered body due to ultraviolet light. Herein, the degree of the wavelength distribution property may be evaluated by the ratio Re(450)/Re(550) of the in-plane retardations Re(450) and Re(550) at the wavelengths of 450 nm and 550 nm. Therefore, the ratio Re(450)/Re(550) of the in-plane retardation of the above-mentioned optical layered body does not change to a large extent even when irradiated with light containing ultraviolet light. Specifically, the absolute value |{Re300(450)/Re300(550)}−{Re0(450)/Re0(550)}| of the difference between the ratio Re0(450)/Re0(550) of the in-plane retardation of the optical layered body before exposed to the xenon lamp and the ratio Re300(450)/Re300(550) of the in-plane retardation of the optical layered body after exposed to the xenon lamp for 300 hours can be reduced. The ratio {Re300(450)/Re300(550)}/{Re0(450)/Re0(550)} of the in-plane retardation ratio Re0(450)/Re0(550) of the optical layered body before exposed to the xenon lamp and the ratio Re300(450)/Re300(550) of the in-plane retardation of the optical layered body after exposed to the xenon lamp for 300 hours can also be approximated to 1.

Furthermore, since the optical layered body has high resistance to ultraviolet light, it is usually less prone to cause coloration even when it is irradiated with light containing ultraviolet light. Specifically, even after the exposure of the optical layered body to a xenon lamp for 300 hours, yellowing of the liquid crystal cured layer due to deterioration can be suppressed.

Such suppression of a change in optical properties and of coloration due to ultraviolet light is particularly advantageous when the optical layered body includes an electroconductive layer. The optical layered body containing an electroconductive layer can be used as a film sensor member for touch panels. A film sensor member for touch panels generally tends to be exposed to outside light containing ultraviolet light, and such a tendency is particularly remarkable when the film sensor member for touch panels is used in an out-cell type touch panel. However, as to the above-described optical layered body having an ultraviolet light resistance enhanced by a substrate layer, a change in optical properties and coloration are suppressed even when exposed to outside light, and thereby the resulting touch panel can achieve a long lifetime.

It is preferable that the optical layered body has a high light transmittance at a visible wavelength from the viewpoint of stably exhibiting a function as an optical member. For example, the light transmittance of the optical layered body in the wavelength range of 400 nm to 700 nm is preferably 85% to 100%, more preferably 87% to 100%, and particularly preferably 90% to 100%.

It is preferable that the optical layered body has a small haze from the viewpoint of enhancing the image sharpness of the image display device incorporating the optical layered body. The haze of the optical layered body is preferably 1% or less, more preferably 0.8% or less, and particularly preferably 0.5% or less.

The thickness of the optical layered body is preferably 1.0 μm or more, more preferably 3.0 μm or more, and particularly preferably 5.0 μm or more, and is preferably 100 μm or less, more preferably 90 μm or less, and particularly preferably 80 μm or less.

The optical layered body may have a long-length shape or a sheet piece shape. Usually, the optical layered body is produced as a member having a long-length shape. Then, after the long-length optical layered body is bonded to a linear polarizer to obtain a circular polarizing plate, the circular polarizing plate is cut out so as to have a sheet piece shape.

[Method for Producing Optical Layered Body]

The method for producing the optical layered body may be any method. For example, the optical layered body may be produced by preparing a substrate layer and an optically anisotropic layer, and then bonding the substrate layer and the optically anisotropic layer using a tackiness agent or an adhesive agent if necessary. It is preferable that such bonding is performed by a roll-to-roll method using a long-length substrate layer and a long-length optically anisotropic layer.

In particular, in the case of producing an optical layered body including an electroconductive layer, the electroconductive layer may be formed after the substrate layer and the optically anisotropic layer were bonded to each other. However, from the viewpoint of avoiding damage to the optically anisotropic layer upon forming the electroconductive layer, it is preferable to perform formation of the electroconductive layer on the substrate layer and thereafter perform bonding thereof with the optically anisotropic layer.

[7. Circular Polarizing Plate]

By combining the above-described optical layered body with a linear polarizer, a circular polarizing plate can be obtained. Such a circularly polarizing plate includes an optical layered body and a linear polarizer, and, if necessary, may further include an optional layer. In this case, the circular polarizing plate may include the linear polarizer, the substrate layer, and the optically anisotropic layer in this order, or may include the linear polarizer, the optically anisotropic layer, and the substrate layer in this order.

For example, an optical layered body including an optically anisotropic layer functioning as a λ/4 plate may be combined with a linear polarizer such that the slow axis direction of the optically anisotropic layer and the polarized light transmission axis of the linear polarizer form a specific angle, to thereby obtain a circular polarizing plate. Herein, the specific angle is preferably 45°±5°, more preferably 45°±3°, and particularly preferably 45°±1°.

In particular, as to an optical layered body including an optically anisotropic layer functioning as a broadband λ/4 plate that contains a liquid crystal cured layer functioning as one of a λ/4 plate and a λ/2 plate and a layer functioning as the other of the λ/4 plate and the λ/2 plate, it is preferable that such an optical layered body is combined with a linear polarizer so as to satisfy any of the following relationships (X4), (X5), and (X6). By satisfying any of these relationships, a circularly polarizing plate capable of functioning in a wide wavelength range can be obtained.

(X4) The angle formed by the slow axis of the liquid crystal cured layer functioning as one of the λ/4 plate and the λ/2 plate with respect to the polarized light transmission axis of the linear polarizer is preferably 75°±50, more preferably 75°±3°, and particularly preferably 75°±1°, and the angle formed by the slow axis of the layer functioning as the other of the λ/4 plate and the λ/2 plate with respect to the polarized light transmission axis of the linear polarizer is preferably 15°±5°, more preferably 15°±3°, and particularly preferably 15°±1°.

(X5) The angle formed by the slow axis of the liquid crystal cured layer functioning as one of the λ/4 plate and the λ/2 plate with respect to the polarized light transmission axis of the linear polarizer is preferably 15°±5°, more preferably 15°±3°, and particularly preferably 15°±1°, and the angle formed by the slow axis of the layer functioning as the other of the λ/4 plate and the λ/2 plate with respect to the polarized light transmission axis of the linear polarizer is preferably 75°±5°, more preferably 75°±3°, and particularly preferably 75°±1°.

(X6) The angle formed by the slow axis of the liquid crystal cured layer functioning as one of the λ/4 plate and the λ/2 plate with respect to the polarized light transmission axis of the linear polarizer is preferably 22.5°+5°, more preferably 22.5°±3°, and particularly preferably 22.5°±1°, and the angle formed by the slow axis of the layer functioning as the other of the λ/4 plate and the λ/2 plate with respect to the polarized light transmission axis of the linear polarizer is preferably 90°±5°, more preferably 90°±3°, and particularly preferably 90°±1°.

Alternatively, for example, the optical layered body including the optically anisotropic layer functioning as the λ/2 plate may be combined with a linear polarizer together with an optional layer that can function as a λ/4 plate, to thereby obtain a circular polarizing plate. Specifically, the optical layered body including the optically anisotropic layer functioning as the λ/2 plate and an optional layer functioning as the λ/4 plate may be combined with each other to obtain a broadband λ/4 plate, and then the broadband λ/4 plate may be combined with a linear polarizer to obtain a circular polarizing plate. In this case, it is preferable to dispose the λ/2 plate of the broadband λ/4 plate on the side of the linear polarizer, and the directions of the slow axis and the polarized light transmission axis of each layer may be set in the same manner as the relationships (X4), (X5) and (X6) described above.

A linear polarizer to be combined with the optical layered body is an optical member having a polarized light transmission axis and a polarized light absorption axis, and is capable of absorbing linearly polarized light having a vibration direction parallel to the polarized light absorption axis and allowing to pass therethrough linearly polarized light having a vibration direction parallel to the polarized light transmission axis.

Examples of the linear polarizer may include a film obtained by performing appropriate treatments such as dyeing treatment with a dichroic substance such as iodine and a dichroic dye, stretching treatment, and crosslinking treatment to a film of a vinyl alcohol-based polymer such as polyvinyl alcohol and partially formalized polyvinyl alcohol in an appropriate order and manner. Usually, in the stretching treatment for producing the linear polarizer, the film is stretched in the lengthwise direction, and therefore a polarized light absorption axis parallel to the lengthwise direction of the linear polarizer and a polarized light transmission axis parallel to the width direction of the linear polarizer may be expressed in the obtained linear polarizer. It is preferable that the linear polarizer has an excellent degree of polarization. The thickness of the linear polarizer is generally 5 μm to 80 μm, but is not limited thereto.

In combination with the optical layered body and the linear polarizer, the circular polarizing plate may further include an optional film layer such as a protective film, an optical compensation film for a liquid crystal cell, and an antireflection film for an organic EL display device. Examples of the protective film may include resin films formed of an alicyclic structure-containing polymer, a cellulose resin such as triacetyl cellulose, and the like. Examples of the optical compensation film for liquid crystal cells may include optical films described in Japanese Patent Application Laid-Open No. 2008-517344 A, Japanese Patent Application Laid-Open No. 2006-285208 A, and Japanese Patent Application Laid-Open No. Hei 11-133408 A. Furthermore, examples of the antireflection film for an organic EL display device may include broadband λ/4 plates described in the aforementioned Patent Literatures 4 to 6 and the like.

The circular polarizing plate may further include a tacky layer or an adhesive layer for bonding the optical layered body and the linear polarizer.

The method for producing the circular polarizing plate may be any method, and for example, the circular polarizing plate may be produced by bonding the optical layered body and the linear polarizer. Such bonding is preferably performed by a roll-to-roll method using a long-length optically anisotropic layer and a long-length linear polarizer.

Since such a circular polarizing plate described above includes the substrate layer capable of suppressing transmission of ultraviolet light, deterioration of the liquid crystal cured layer contained in the optically anisotropic layer due to ultraviolet light can be suppressed, and further, deterioration of the linear polarizer due to ultraviolet light can also be usually suppressed. Therefore, this circular polarizing plate has high light resistance, and it is thus possible to suppress a decrease in the degree of polarization due to ultraviolet light, and it is further possible to suppress coloration due to light irradiation.

[8. Touch Panel]

Using the above-described circular polarizing plate, a touch panel may be obtained. In this case, as the circular polarizing plate, a circular polarizing plate including an electroconductive layer is usually used. With this configuration, a touch panel having a circular polarizing plate containing an electroconductive layer can be obtained.

The touch panel herein means an input unit that is provided in an image display device so that information input can be performed by allowing a user to touch a specific position while, if necessary, the user refers to images displayed on the display surface of the image display device. Examples of the operation detecting type of the touch panel may include a resistance film type, an electromagnetic induction type, and an electrostatic capacitance type. The above-described circular polarizing plate is particularly preferably applied to an electrostatic capacitive touch panel.

The image display system of the image display device in which the touch panel is provided is not particularly limited, and any optional display device system such as a liquid crystal display device and an organic electroluminescent display device may be employed. For example, when the touch panel is provided in a liquid crystal display device, the liquid crystal display device usually includes: a liquid crystal cell containing a pair of substrate plates and a liquid crystal compound enclosed therebetween; and a pair of polarizing plates provided on the front and back surfaces of the liquid crystal cell. In the liquid crystal display device, the location of the electroconductive layer of the circular polarizing plate is not particular limited. For example, the electroconductive layer may be provided on the outside (viewing side) of the viewing-side polarizing plate of the display device (out-cell type), or may be provided between the viewing-side polarizing plate and the liquid crystal cell of the display device (mid-cell type or on-cell type), or may be provided on the inside of the liquid crystal cell (opposite side from the display surface) (in-cell type).

In particular, from the viewpoint of effectively utilizing the ultraviolet light transmission suppressing function of the substrate layer that supports the electroconductive layer to suppress the deterioration of the members provided in the device due to ultraviolet light, the electroconductive layer is preferably provided at a location of the out-cell type. Therefore, upon obtaining the above-described touch panel using a circular polarizing plate, the circular polarizing plate is preferably provided so that the above-described optical layered body is used as a film sensor member of an out-cell type touch panel.

[9. Image Display Device]

An image display device includes an image display element and the above-described circular polarizing plate provided on the viewing side of the image display element. In the aforementioned image display device, the circular polarizing plate is provided in such a manner that the optically anisotropic layer and the substrate layer contained in the circular polarizing plate are positioned in this order from the image display element side. In the case of such an image display device, the optically anisotropic layer is protected by the substrate layer from outside light containing ultraviolet light, and therefore a change in the optical properties of the optically anisotropic layer due to outside light can be suppressed, and consequently a change in the optical properties of the optical layered body itself can also be suppressed. Further, since the substrate layer suppresses the transmission of ultraviolet light, deterioration due to ultraviolet light of the components contained in the image display element can usually be suppressed, and as a result thereof, the image display device can achieve a long lifetime.

The orientation of the circular polarizing plate provided in the image display device may be set depending on a function required of the circular polarizing plate. For example, when the optical layered body and the linear polarizer are provided in this order from the image display element side, the circular polarizing plate can exhibit the function of suppressing the reflection of outside light. Further, for example, when the linear polarizer and the optical layered body are provided in this order from the image display element side, images can be displayed by circular polarized light that has passed through the circular polarizing plate, and therefore the circular polarizing plate can exhibit the function of enhancing the visibility of images viewed through polarized sunglasses.

There are a variety of image display devices which are different in the type of image display element, and typical examples thereof may include a liquid crystal display device having a liquid crystal cell as an image display element, and an organic EL display device having an organic EL element as an image display element. Embodiments of these image display devices will be described hereinbelow, although the structures of the image display devices are not limited to those described in the following embodiments.

Figure 3:
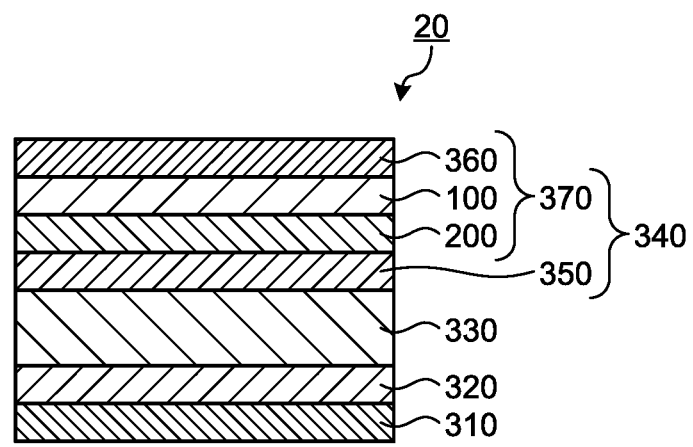
FIG. 3 is a cross-sectional view schematically showing an example of a liquid crystal display device as an image display device according to an embodiment of the present invention.

FIG. 3 is a cross-sectional view schematically showing an example of a liquid crystal display device 20 as an image display device according to an embodiment of the present invention.

As shown in FIG. 3, the liquid crystal display device 20 include: a light source 310, a light source-side linear polarizer 320; a liquid crystal cell 330 as an image display element; and a circular polarizing plate 340 in this order. The circular polarizing plate 340 includes: a linear polarizer 350; and an optical layered body 370 including an optically anisotropic layer 200, a substrate layer 100, and an electroconductive layer 360 in this order from the liquid crystal cell 330 side.

In the liquid crystal display 20, images are displayed by light that has emitted from the light source 310 and passed through the light source-side linear polarizer 320, the liquid crystal cell 330, the linear polarizer 350, and the optically anisotropic layer 200 as a layer functioning as a λ/4 plate. The light to be utilized for displaying images is linear polarized light when having been passed through the linear polarizer 350, but is converted to circular polarized light by passing through the optically anisotropic layer 200. Therefore, in the liquid crystal display device 20, images are displayed by circular polarized light so that when viewed through polarized sunglasses, images can be visually recognized. Further, in the liquid crystal display device 20, the electroconductive layer 360 can function as an electroconductive layer for touch panel. Therefore, the liquid crystal display device 20 including a touch panel can be realized.

The liquid crystal cell 20 may be, for example, a liquid crystal cell of any mode such as in-plane switching (IPS) mode, vertical alignment (VA) mode, multi-domain vertical alignment (MVA) mode, continuous pinwheel alignment (CPA) mode, hybrid alignment nematic (HAN) mode, twisted nematic (TN) mode, supertwisted nematic (STN) mode, or optical compensated bend (OCB) mode.

Figure 4:
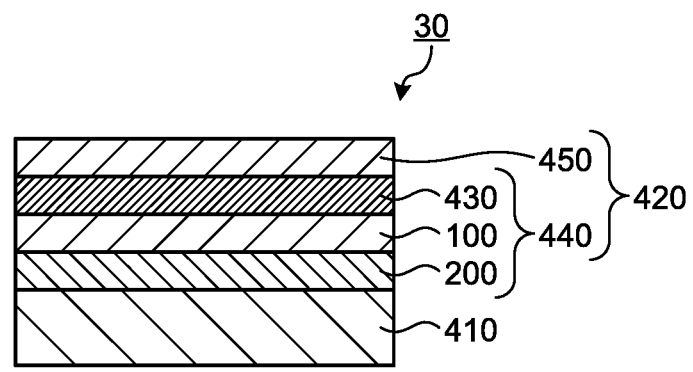
FIG. 4 is a cross-sectional view schematically showing an example of an organic EL display device as an image display device according to an embodiment of the present invention.

FIG. 4 is a cross-sectional view schematically showing an example of an organic EL display device 30 as an image display device according to an embodiment of the present invention.

As shown in FIG. 4, the organic EL display device 30 includes an organic EL element 410 as an image display element and a circular polarizing plate 420. The circular polarizing plate 420 includes: an optical layered body 440 including an optically anisotropic layer 200, a substrate layer 100, and an electroconductive layer 430; and a linear polarizer 450 in this order from the organic EL element 410 side.

As to the light entering from the outside of the device into the organic EL display device 30, only a part of linear polarized light thereof passes through the linear polarizer 450 and is converted to circular polarized light by passing through the optically anisotropic layer 200. The circular polarized light is reflected by a component that reflects light in the display device (e.g., a reflective electrode (not shown) in the organic EL element 410) and again passes through the optically anisotropic layer 200 to be thereby converted into linear polarized light which has a vibration direction orthogonal to that of the incident linearly polarized light. The resulting linear polarized light does not pass through the linear polarizer 450. In this manner, the function of antireflection is achieved (see Japanese Patent Application Laid-Open No. Hei. 9-127885 A for the principles of antireflection in the organic EL display device). In the organic EL display device 30, the electroconductive layer 430 functions as an electroconductive layer for touch panel. Therefore, the organic EL display device 30 including a touch panel can be realized.

The organic EL element 410 includes a transparent electrode layer, a light-emitting layer, and an electrode layer in this order, and the light-emitting layer is capable of emitting light by the application of an electric voltage from the transparent electrode layer and the electrode layer. Examples of a material constituting the organic light-emitting layer may include a polyparaphenylene vinylene-based material, a polyfluorene-based material, and a polyvinyl carbazole-based material. The light-emitting layer may have a layered body of layers different in emission color or a mixed layer having a layer containing a certain coloring agent doped with a coloring agent of a different color. The organic EL element 410 may further include a functioning layer such as a barrier layer, a hole injection layer, a hole transport layer, an electron injection layer, an electron transport layer, an equipotential surface-forming layer, or a charge generating layer.

EXAMPLES

The present invention will be specifically described hereinbelow by illustrating Examples. However, the present invention is not limited to the Examples described below. The present invention may be optionally modified for implementation without departing from the scope of claims of the present invention and its equivalents. In the following description, "%" and "part" representing quantity are on the basis of weight, unless otherwise specified. The operations described below were performed under the conditions of normal temperature and normal pressure in the atmospheric air, unless otherwise specified. Furthermore, in the following description, "sccm" is a unit of a gas flow rate, and indicates the amount of gas flowing per minute in terms of the volume ($cm^3$) of the gas at 25° C. and 1 atm.

[Evaluation Methods]
[Method for Measuring Retardation]

The in-plane retardation and thickness-direction retardation of a film were measured using a phase difference meter ("AXO SCAN" manufactured by Axometric).

[Method for Measuring Light Transmittance]

The light transmittance of a multilayer film having a coating-subject substrate and a liquid crystal cured layer was measured at wavelengths of 380 nm and 390 nm with the use of a UV-Vis-NIR spectrophotometer ("V-7200" manufactured by JASCO Corporation). The coating-subject substrate used in Examples and Comparative Examples, which will be described later, does not absorb wavelengths of 380 nm and 390 nm. Therefore, the light transmittances at wavelengths of 380 nm and 390 nm of the multilayer film were employed as light transmittances at wavelengths of 380 nm and 390 nm of the liquid crystal cured layer contained in the multilayer film, respectively.

The light transmittances at wavelengths of 380 nm and 390 nm of a phase difference film used in Examples 5 and 6 were measured using a UV-Vis-NIR spectrophotometer ("V-7200" manufactured by JASCO Corporation).

[Method for Evaluating Curl Amount of Optical Layered Body Including Electroconductive Layer]

From an optical layered body including an electroconductive layer, a square piece having a length of 5 cm and a width of 5 cm was cut out to obtain a test piece. The test piece was placed on a flat stage with the electroconductive layer facing downward. The height of each of the raised four corners of the test piece from the surface of the stage was measured with a scale. The average of measured values of the height was adopted as the curl amount.

[Method for Xenon Lamp Exposure Test]

The optically anisotropic layer-side surface of an optical layered body was bonded to a glass plate (thickness: 0.7 mm) via a tackiness agent ("CS9621T" manufactured by Nitto Denko Corporation) to obtain a sample.

The in-plane retardations Re0(450), Re0(550), and Re0(650) at wavelengths of 450 nm, 550 nm, and 650 nm of the optical layered body before exposed to a xenon lamp were measured using the obtained sample.

Then, the substrate layer-side surface of the optical layered body of the above-described sample was irradiated with light emitted from a xenon lamp, whose spectral irradiance at a wavelength of 420 nm was 0.8 W/m$^2$/nm and accumulated irradiance at a wavelength of 300 nm to 400 nm was 48 W/m$^2$, for 300 hours.

Then, the in-plane retardations Re300(450), Re300(550), and Re300(650) at wavelengths of 450 nm, 550 nm, and 650 nm of the optical layered body after exposed to the xenon lamp were measured using the above-described sample.

Production Example 1. Production of Substrate Layer (Preparation of Thermoplastic Resin)

Pellets of an amorphous norbornene-based polymer COP (manufactured by ZEON Corporation, glass transition temperature Tg=126° C.) were dried at 100° C. for 5 hours. 89.0 parts of the dried pellets and 11.0 parts of a benzotriazole-based ultraviolet absorber ("LA-31" manufactured by ADEKA Corporation) were mixed with a twin screw extruder. The mixture thus obtained was fed into a hopper connected to a single screw extruder, and melt-extruded through the single screw extruder to obtain a thermoplastic resin (J1). The thermoplastic resin (J1) had an ultraviolet absorber content of 11.0% by weight.

(Formation of Layers)

A double flight-type single screw extruder (screw diameter D=50 mm, ratio of effective length L of screw relative to diameter D of screw (L/D)=28) was prepared which was equipped with a leaf disc polymer filter having a mesh size of 3 μm. The thermoplastic resin (J1) was introduced as a resin for forming an intermediate layer into the single screw extruder, melted, and supplied to a single-layer die having a die lip with a surface roughness Ra of 0.1 μm through a feed block under conditions of an extruder outlet temperature of 260° C. and an extruder gear pump rotation speed of 10 rpm.

On the other hand, a single screw extruder (screw diameter D=50 mm, ratio of effective length L of screw relative to diameter D of screw (L/D)=28) was prepared which was equipped with a leaf disc polymer filter having a mesh size of 3 μm. As a thermoplastic resin (J2) for forming a first outer layer and a second outer layer, the amorphous norbornene-based polymer pellets (manufactured by ZEON Corporation, glass transition temperature Tg=126° C.) that are the same as those used for preparing the thermoplastic resin (J1) were introduced into the single screw extruder. Then, the introduced thermoplastic resin (J2) was supplied to the above-described single-layer die through a feed block under conditions of an extruder outlet temperature of 285° C. and an extruder gear pump rotation speed of 4 rpm.

Then, the thermoplastic resins (J1) and (J2) were co-extruded through the single-layer die at 280° C. to form a film having three layers containing a layer of the resin for forming a first outer layer, a layer of the resin for forming an intermediate layer, and a layer of the resin for forming a second outer layer. The extruded thermoplastic resins (J1) and (J2) were cast onto a cooling roll adjusted to a temperature of 150° C. to obtain, as a substrate layer, a two-type three-layer film having a first outer layer (thickness: 10 μm) formed of the thermoplastic resin (J2), an intermediate layer (thickness: 20 μm) formed of the thermoplastic resin (J1), and a second outer layer (thickness: 10 μm) formed of the thermoplastic resin (J2). The two-type three-layer film refers to a film having a three-layer structure formed of two types of resins. The air gap during the co-extrusion was set to 50 mm. Edge pinning was adopted to cast the film-shaped resin in a molten state onto the cooling roll. The obtained substrate layer had a width of 1450 mm and a thickness of 40 μm. Then, each side edge of the substrate layer was trimmed by 50 mm to adjust the width of the substrate layer to 1350 mm. The substrate layer thus obtained was wound up to obtain a long-length roll. The substrate layer had an in-plane retardation of 4 nm and a thickness-direction retardation of 13 nm.

Production Example 2. Production of Substrate Layer

A substrate layer was produced by the same operation as that of Production Example 1 except that the mixing ratio of the pellets of an amorphous norbornene-based polymer COP and the benzotriazole-based ultraviolet absorber was changed to 100.0 parts of the dried pellets and 5.5 parts of the benzotriazole-based ultraviolet absorber, to prepare a thermoplastic resin for forming an intermediate layer. The intermediate layer of the substrate layer thus obtained had an ultraviolet absorber content of 5.2% by weight. The substrate layer had an in-plane retardation of 5 nm and a thickness-direction retardation of 14 nm.

Production Example 3. Production of Liquid Crystal Composition A

A polymerizable liquid crystal compound represented by the following formula (A1) was prepared. This polymerizable liquid crystal compound is a reverse wavelength distribution liquid crystal compound. 21.25 parts of the polymerizable liquid crystal compound represented by the formula (A1), 0.11 part of a surfactant ("Surflon S420" manufactured by AGC Seimi Chemical Co., Ltd.), 0.64 part of a polymerization initiator ("IRGACURE 379" manufactured by BASF), and 78.00 parts of a solvent (cyclopentanone manufactured by ZEON Corporation) were mixed to prepare a liquid crystal composition A.

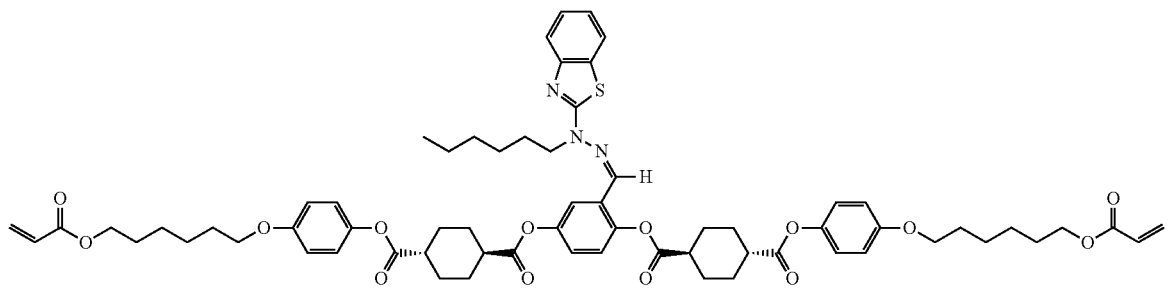

(A1)

Production Example 4. Production of Liquid Crystal Composition B

A polymerizable liquid crystal compound represented by the following formula (B1) was prepared. This polymerizable liquid crystal compound is a forward wavelength distribution liquid crystal compound. 22.00 parts of the polymerizable liquid crystal compound represented by the formula (B1), 0.12 part of a surfactant ("Ftergent FTX-209F" manufactured by NEOS COMPANY LIMITED), 0.77 part by weight of a polymerization initiator ("IRGACURE 379" manufactured by BASF), and 77.11 parts of a solvent (methyl ethyl ketone) were mixed to prepare a liquid crystal composition B.

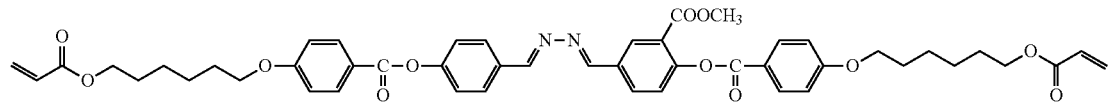

(B1)

Production Example 5. Production of Liquid Crystal Composition C

A polymerizable liquid crystal compound represented by the following formula (C1) ("LC242" manufactured by BASF) was prepared. This polymerizable liquid crystal compound is a forward wavelength distribution liquid crystal compound. 24.15 parts of the polymerizable liquid crystal compound represented by the formula (C1), 0.12 part of a surfactant ("Ftergent FTX-209F" manufactured by NEOS COMPANY LIMITED), 0.73 part by weight of a polymerization initiator ("IRGACURE 379" manufactured by BASF), and 75.00 parts of a solvent (methyl ethyl ketone) were mixed to prepare a liquid crystal composition C.

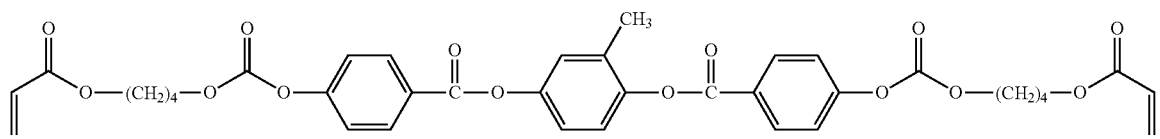

(C1)

Production Example 6: Production of Adhesive Agent 70 parts of 2-hydroxybutylacrylate ("LIGHT ACRYLATE HOB-A" manufactured by Kyoeisha Chemical Co., Ltd), 22 parts of isobornyl acrylate ("IBXA" manufactured by Osaka Organic Chemical Industry Ltd.), 5 parts of trimethylolpropane triglycidyl ether ("Epolite 100MF" manufactured by Kyoeisha Chemical Co., Ltd.), and 3 parts of a photopolymerization initiator (Irgacure 2959" manufactured by BASF) were mixed, sufficiently stirred, and sufficiently defoamed to obtain a ultraviolet curable adhesive agent D.

Example 1

(Formation of Optically Anisotropic Layer)

A long-length obliquely-stretched film formed of a norbornene-based polymer COP (manufactured by ZEON Corporation) was prepared as a coating-subject substrate. The coating-subject substrate is a film obtained by obliquely stretching a norbornene-based polymer COP film, and had a slow axis forming an angle of 45° with respect to the width direction of the film. The coating-subject substrate had a thickness of 60 μm and an in-plane retardation of 141 nm. The coating-subject substrate was prepared as a roll obtained by winding up the coating-subject substrate with a masking film having been attached to one surface thereof.

The coating-subject substrate was drawn from the roll and conveyed in its lengthwise direction at a room temperature of 25° C. while the masking film was being peeled off. The liquid crystal composition A produced in Production Example 3 was directly applied onto the surface of the conveyed coating-subject substrate with a die coater, the surface for application being the surface from which the masking film had been peeled off, to form a layer of the liquid crystal composition A.

Then, the layer of the liquid crystal composition A was subjected to an orientation treatment at 110° C. for 2.5 minutes. Then, the layer of the liquid crystal composition A was irradiated with ultraviolet light in a nitrogen atmosphere (oxygen concentration: 0.1% or less) at an accumulated irradiance of 1000 mJ/cm$^2$, the irradiation being performed from the side of the coating-subject substrate that is the opposite to the layer of the liquid crystal composition A, to thereby cure the layer of the liquid crystal composition A. In this manner, a homogeneously-oriented liquid crystal cured layer having a dry thickness of 2.2 μm was formed on the coating-subject substrate to obtain a multilayer film including the coating-subject substrate and an optically anisotropic layer formed of the liquid crystal cured layer. The deviation between the slow axis direction of the optically anisotropic layer and the slow axis of the coating-subject substrate was 1°.

For the obtained multilayer film, the light transmittance of the liquid crystal cured layer was measured by the above-described method. As a result, the light transmittance at 380 nm was 4.4%, and the light transmittance at 390 nm was 16.4%.

(Production of Optical Layered Body)

The substrate layer produced in Production Example 1 and the optically anisotropic layer of the above-described multilayer film were bonded together via the adhesive agent D produced in Production Example 6, and the layered body was irradiated with ultraviolet light from the optically anisotropic layer side. Then, the coating-subject substrate was peeled off, to thereby produce an optical layered body including the substrate layer, an adhesive layer, and the optically anisotropic layer formed of the liquid crystal cured layer in this order.

The obtained optical layered body was evaluated by the above-described methods.

Example 2

Instead of the liquid crystal composition A, the liquid crystal composition B produced in Production Example 4 was used. In addition, the coating thickness of the liquid crystal composition B was changed so as to obtain a liquid crystal cured layer having a thickness of 1.2 μm. The formation and evaluation of the liquid crystal cured layer and the production and evaluation of the optical layered body were performed by the same operation as that of Example 1 except for the above matters.

Example 3

Instead of the liquid crystal composition A, the liquid crystal composition C produced in Production Example 5 was used. In addition, the coating thickness of the liquid crystal composition C was changed so as to obtain a liquid crystal cured layer having a thickness of 1.0 μm. The formation and evaluation of the liquid crystal cured layer and the production and evaluation of the optical layered body were performed by the same operation as that of Example 1 except for the above matters.

Example 4

Instead of the coating-subject substrate used in Example 1, another long-length obliquely-stretched film (angle between film width direction and slow axis: 15°, thickness: 55 μm, in-plane retardation: 145 nm) formed of a norbornene-based polymer COP (manufactured by ZEON Corporation) was used as a coating-subject substrate. Further, instead of the liquid crystal composition A, the liquid crystal composition C produced in Production Example 5 was used. Further, the coating thickness of the liquid crystal composition C was changed so as to obtain a liquid crystal cured layer having a dry thickness of 1.1 μm. A multilayer film including the coating-subject substrate and the liquid crystal cured layer formed of a cured product of the liquid crystal composition C was obtained by the same operation as that of the process (Formation of optically anisotropic layer) in Example 1 except for the above-described matters. The obtained liquid crystal cured layer was homogeneously oriented, and the deviation of the slow axis direction thereof from the slow axis direction of the coating-subject substrate was 1°. The liquid crystal cured layer had a light transmittance at 380 nm of 81.2% and a light transmittance at 390 nm of 85.3%. The obtained liquid crystal cured layer was a layer that functions as a λ/4 plate.

As a phase difference film that functions as a λ/2 plate, a long-length obliquely-stretched film formed of a norbornene-based polymer COP (manufactured by ZEON Corporation) was prepared. This phase difference film had a slow axis forming an angle of 75° with respect to its film width direction, a thickness of 50 μm, and an in-plane retardation of 265 nm.

The aforementioned phase difference film and the liquid crystal cured layer of the aforementioned multilayer film were bonded together via a tackiness agent ("CS9621T" manufactured by Nitto Denko Corporation) so that a crossing angle between the slow axis of the phase difference film and the slow axis of the liquid crystal cured layer was 60°. Then, the coating-subject substrate was peeled off to obtain an optically anisotropic layer including the liquid crystal cured layer, the tacky layer, and the phase difference film in this order.

The substrate layer produced in Production Example 1 and the liquid crystal cured layer-side surface of the optically anisotropic layer were bonded together via the adhesive agent D produced in Production Example 6, and the layered body was irradiated with ultraviolet light from the optically anisotropic layer side to obtain an optical layered body including the substrate layer; the adhesive layer; and the optically anisotropic layer having the liquid crystal cured layer, the tacky layer, and the phase difference film; in this order.

The obtained optical layered body was evaluated by the above-described methods.

Example 5

Instead of the coating-subject substrate used in Example 1, another long-length obliquely-stretched film (angle between film width direction and slow axis: 75°, thickness: 25 μm, in-plane retardation: 145 nm) formed of a norbornene-based polymer COP (manufactured by ZEON Corporation) was used as a coating-subject substrate. Further, instead of the liquid crystal composition A, the liquid crystal composition C produced in Production Example 5 was used. Further, the coating thickness of the liquid crystal composition C was changed so as to obtain a liquid crystal cured layer having a dry thickness of 2.1 μm. A multilayer film including the coating-subject substrate and the liquid crystal cured layer formed of a cured product of the liquid crystal composition C was obtained by the same operation as that of the process (Formation of optically anisotropic layer) in Example 1 except for the above-described matters. The obtained liquid crystal cured layer was homogeneously oriented, and the deviation of the slow axis direction thereof from the slow axis direction of the coating-subject substrate was 0.8°. The liquid crystal cured layer had a light transmittance at 380 nm of 80.3% and a light transmittance at 390 nm of 84.6%. The obtained liquid crystal cured layer was a layer that functions as a λ/2 plate.

As a phase difference film that functions as a λ/4 plate, a long-length obliquely-stretched film formed of a norbornene-based polymer COP (manufactured by ZEON Corporation) was prepared. This phase difference film had a slow axis forming an angle of 15° with respect to its film width direction, a thickness of 22 μm, and an in-plane retardation of 142 nm.

The aforementioned phase difference film and the liquid crystal cured layer of the aforementioned multilayer film were bonded together via a tackiness agent ("CS9621T" manufactured by Nitto Denko Corporation) so that a crossing angle between the slow axis of the phase difference film and the slow axis of the liquid crystal cured layer was 600°. Then, the coating-subject substrate was peeled off to obtain an optically anisotropic layer including the liquid crystal cured layer, the tacky layer, and the phase difference film in this order.

The substrate layer produced in Production Example 1 and the liquid crystal cured layer-side surface of the optically anisotropic layer were bonded together via the adhesive agent D produced in Production Example 6, and the layered body was irradiated with ultraviolet light from the optically anisotropic layer side to obtain an optical layered body including the substrate layer; the adhesive layer; and the optically anisotropic layer having the liquid crystal cured layer, the tacky layer, and the phase difference film; in this order.

The obtained optical layered body was evaluated by the above-described methods.

Example 6

Instead of the coating-subject substrate used in Example 1, the coating-subject substrate used in Example 5 (the angle formed by the slow axis with respect to the film width direction was 75°) was used. Further, the coating thickness of the liquid crystal composition A was changed so as to obtain a liquid crystal cured layer having a dry thickness of 4.4 μm. A first multilayer film including the coating-subject substrate and the liquid crystal cured layer functioning as the λ/2 plate formed of a cured product of the liquid crystal composition A was obtained by the same operation as that of the process (Formation of optically anisotropic layer) in Example 1 except for the above-described matters. The obtained liquid crystal cured layer was homogeneously oriented, and the deviation of the slow axis direction thereof from the slow axis direction of the coating-subject substrate was 1.0°. The liquid crystal cured layer had a light transmittance at 380 nm of 3.8% and a light transmittance at 390 nm of 15.8%.

Instead of the coating-subject substrate used in Example 1, the coating-subject substrate used in Example 4 (the angle formed by the slow axis with respect to the film width direction was 15°) was used. Further, the coating thickness of the liquid crystal composition A was changed so as to obtain a liquid crystal cured layer having a dry thickness of 2.2 μm. A second multilayer film including the coating-subject substrate and the liquid crystal cured layer functioning as the λ/4 plate formed of a cured product of the liquid crystal composition A was obtained by the same operation as that of the process (Formation of optically anisotropic layer) in Example 1 except for the above-described matters. The obtained liquid crystal cured layer was homogeneously oriented, and the deviation of the slow axis direction thereof from the slow axis direction of the coating-subject substrate was 0.7°. The liquid crystal cured layer had a light transmittance at 380 nm of 4.4% and a light transmittance at 390 nm of 16.4%.

The liquid crystal cured layer of the aforementioned first multilayer film and the liquid crystal cured layer of the aforementioned second multilayer film were bonded together via a tackiness agent ("CS9621T" manufactured by Nitto Denko Corporation) so that a crossing angle between the slow axis of the liquid crystal cured layer of the first multilayer film and the slow axis of the liquid crystal cured layer of the second multilayer film was 60°. As a result, an optically anisotropic layer including the liquid crystal cured layer functioning as the λ/4 plate, the tacky layer, and the liquid crystal cured layer functioning as the λ/2 plate in this order was formed between two coating-subject substrates.

Then, the coating-subject substrate on one side of the aforementioned optically anisotropic layer was peeled off. The exposed optically anisotropic layer was bonded to the substrate layer produced in Production Example 1 via a tackiness agent ("CS9621T" manufactured by Nitto Denko Corporation). Then, the coating-subject substrate on the other side of the optically anisotropic layer was peeled off to produce an optical layered body including the substrate layer; the adhesive layer; and the optically anisotropic layer including the liquid crystal cured layer functioning as the λ/2 plate, the tacky layer, and the liquid crystal cured layer functioning as the λ/4 plate; in this order.

The obtained optical layered body was evaluated by the above-described methods.

Comparative Example 1

Instead of the substrate layer produced in Production Example 1, the substrate layer produced in Production Example 2 was used. The production and evaluation of the optical layered body were performed by the same operation as that of Example 1 except for the above-described matters.

Comparative Example 2

Instead of the substrate layer produced in Production Example 1, the substrate layer produced in Production Example 2 was used. The production and evaluation of the optical layered body were performed by the same operation as that of Example 2 except for the above-described matters.

Comparative Example 3

Instead of the substrate layer produced in Production Example 1, the substrate layer produced in Production Example 2 was used. The production and evaluation of the optical layered body were performed by the same operation as that of Example 3 except for the above-described matters.

[Results]

The results of Examples and Comparative Examples described above are shown in the following table. In the following table, the meanings of the abbreviations are as follows.

Re: in-plane retardation
Rth: thickness-direction retardation
$T_{380}$: light transmittance at wavelength of 380 nm
$T_{390}$: light transmittance at wavelength of 390 nm.
A1: liquid crystal composition A containing polymerizable liquid crystal compound represented by formula (A1).
B1: liquid crystal composition B containing polymerizable liquid crystal compound represented by formula (B1)
C1: liquid crystal composition C containing polymerizable liquid crystal compound represented by formula (C1)
COP: norbornene polymer
Slow axis direction of coating-subject substrate: angle formed by slow axis of obliquely-stretched film used as coating-subject substrate with respect to film width direction.

TABLE 1

| [Results of Examples] | | | | | | | | |
|---|---|---|---|---|---|---|---|---|
| | Ex. 1 | Ex. 2 | Ex. 3 | Ex. 4 | | Ex. 5 | | Ex. 6 | |
| Substrate layer | | | | | | | | | |
| Production Example No. | 1 | 1 | 1 | 1 | | 1 | | 1 | |
| Re(nm) | 4 | 4 | 4 | 4 | | 4 | | 4 | |
| Rth(nm) | 13 | 13 | 13 | 13 | | 13 | | 13 | |
| $T_{380}$(%) | 0.02 | 0.02 | 0.02 | 0.02 | | 0.02 | | 0.02 | |
| $T_{390}$(%) | 0.22 | 0.22 | 0.22 | 0.22 | | 0.22 | | 0.22 | |
| Optically anisotropic layer | | | | | | | | | |
| Structure | One layer type | One layer type | One layer type | Two layer type | | Two layer type | | Two layer type | |
| Material | A1 | B1 | C1 | COP | C1 | C1 | COP | A1 | A1 |
| Slow axis direction of coating-subject substrate | 45° | 45° | 45° | — | 15° | 75° | — | 75° | 15° |
| Function | λ/4 | λ/2 | λ/4 | λ/2 | λ/4 | λ/2 | λ/4 | λ/2 | λ/4 |
| Thickness | 2.2 | 1.2 | 1.0 | 50 | 1.1 | 2.1 | 22 | 4.4 | 2.2 |
| $T_{380}$(%) | 4.4 | 60.1 | 81.2 | 91.2 | 81.2 | 80.3 | 91.3 | 3.8 | 4.4 |
| $T_{390}$(%) | 16.4 | 71.6 | 85.3 | 91.5 | 85.3 | 84.6 | 91.5 | 15.8 | 16.4 |
| Before exposure to xenon lamp | | | | | | | | | |
| Re0(450) | 115 | 297 | 155 | 110 | | 110 | | 108 | |
| Re0(550) | 139 | 260 | 145 | 140 | | 138 | | 1.37 | |
| Re0(650) | 145 | 239 | 142 | 160 | | 160 | | 161 | |
| Re0(450)/Re0(550) | 0.83 | 1.14 | 1.07 | 0.79 | | 0.80 | | 0.79 | |
| Re0(650)/Re0(550) | 1.04 | 0.92 | 0.98 | 1.14 | | 1.16 | | 1.18 | |
| After exposure to xenon lamp | | | | | | | | | |
| Re300(450) | 120 | 290 | 149 | 114 | | 113 | | 113 | |
| Re300(550) | 145 | 256 | 140 | 143 | | 140 | | 131 | |
| Re300(650) | 147 | 233 | 136 | 158 | | 162 | | 154 | |
| Re300(450)/Re300(550) | 0.83 | 1.13 | 1.06 | 0.80 | | 0.81 | | 0.86 | |
| Re300(650)/Re300(550) | 1.01 | 0.91 | 0.97 | 1.10 | | 1.16 | | 1.18 | |
| Re change ratio | | | | | | | | | |
| Re300(450)/Re0(450) | 0.96 | 1.02 | 1.04 | 0.97 | | 0.97 | | 0.96 | |
| Re300(550)/Re0(550) | 0.96 | 1.02 | 1.04 | 0.98 | | 0.99 | | 1.05 | |
| Re300(650)/Re0(650) | 0.99 | 1.03 | 1.04 | 1.01 | | 0.99 | | 1.05 | |
| Absolute value of wavelength distribution | | | | | | | | | |

TABLE 1-continued

[Results of Examples]

| | Ex. 1 | Ex. 2 | Ex. 3 | Ex. 4 | Ex. 5 | Ex. 6 |
|---|---|---|---|---|---|---|
| change difference | | | | | | |
| $\|(Re0(450)/Re0(550)) - (Re300(450)/Re300(550))\|$ | 0.00 | 0.01 | 0.01 | 0.01 | 0.01 | 0.07 |
| $\|(Re0(650)/Re0(550)) - (Re300(650)/Re300(550))\|$ | 0.03 | 0.01 | 0.01 | 0.04 | 0.00 | 0.00 |

TABLE 2

[Results of Comparative Examples]

| | Comp. Ex. 1 | Comp. Ex. 2 | Comp. Ex. 3 |
|---|---|---|---|
| Substrate layer | | | |
| Production Example No. | 2 | 2 | 2 |
| Re(nm) | 5 | 5 | 5 |
| Rth(nm) | 14 | 14 | 14 |
| $T_{380}$(%) | 50.1 | 50.1 | 50.1 |
| $T_{390}$(%) | 7.3 | 7.3 | 7.3 |
| Optically anisotropic layer | | | |
| Structure | One layer type | One layer type | One layer type |
| Material | A1 | B1 | C1 |
| Slow axis direction of coating-subject substrate | 45° | 45° | 45° |
| Function | λ/4 | λ/2 | λ/4 |
| Thickness | 2.2 | 1.2 | 1.0 |
| $T_{380}$(%) | 4.4 | 60.1 | 81.2 |
| $T_{390}$(%) | 16.4 | 71.6 | 85.3 |
| Before exposure to xenon lamp | | | |
| Re0(450) | 115 | 296 | 156 |
| Re0(550) | 138 | 260 | 145 |
| Re0(650) | 145 | 240 | 143 |
| Re0(450)/Re0(550) | 0.83 | 1.14 | 1.08 |
| Re0(650)/Re0(550) | 1.05 | 0.92 | 0.99 |
| After exposure to xenon lamp | | | |
| Re300(450) | 158 | 277 | 143 |
| Re300(550) | 156 | 247 | 132 |
| Re300(650) | 155 | 222 | 132 |
| Re300(450)/Re300(550) | 1.01 | 1.12 | 1.08 |
| Re300(650)/Re300(550) | 0.99 | 0.90 | 1.00 |
| Re change ratio | | | |
| Re300(450)/Re0(450) | 0.73 | 1.07 | 1.09 |
| Re300(550)/Re0(550) | 0.89 | 1.05 | 1.01 |
| Re300(650)/Re0(650) | 0.94 | 1.08 | 1.08 |
| Absolute value of wavelength distribution change difference | | | |
| $\|(Re0(450)/Re0(550)) - (Re300(450)/Re300(550))\|$ | 0.18 | 0.02 | 0.00 |
| $\|(Re0(650)/Re0(550)) - (Re300(650)/Re300(550))\|$ | 0.06 | 0.02 | 0.01 |

Example 7

(Production of Circular Polarizing Plate)

Samples for xenon lamp exposure test using the optical layered body produced in Example 4 were prepared. One of them was a sample before exposure to the xenon lamp and the other was a sample after exposure to the xenon lamp. The surface of glass plate of each of these samples was subjected to a corona treatment. The surface of the glass plate subjected to a corona treatment and one surface of a polarizing film as a linear polarizer ("HLC2-5618S" manufactured by SANRITZ CORPORATION and having a thickness of 180 μm, a polarized light absorption axis parallel to its lengthwise direction, and a polarized light transmission axis parallel to its width direction) were bonded together via a UV curable adhesive agent ("LE-3000 series" manufactured by Hitachi Chemical Company, Ltd.). The bonding was performed so that the crossing angle between the slow axis of the phase difference film functioning as the λ/2 plate in the optically anisotropic layer and the polarized light absorption axis of the polarizing film was 15°. Then, the adhesive agent was cured by irradiation with ultraviolet light from the polarizing film side. In this manner, circular polarizing plates were obtained, each of which had the substrate layer; the adhesive layer; the optically anisotropic layer including the liquid crystal cured layer, the tacky layer, and the phase difference film; the tacky layer; the glass plate; the adhesive layer; and the linear polarizer; in this order.

(Production of Image Display Device)

Two commercially-available liquid crystal display devices ("iPad" (registered trademark) manufactured by Apple Inc.) were prepared, each of which had a light source, a light source-side linear polarizing plate, a liquid crystal cell, and a viewing-side linear polarizing plate in this order. The display surface part of each of the liquid crystal display devices was disassembled, the viewing-side linear polarizing plate of the liquid crystal display device was removed, and each of the above-described circular polarizing plates was attached instead of the viewing-side linear polarizing plate. In this manner, image display devices (liquid crystal display devices) were obtained, each of which had the substrate layer; the adhesive layer; the optically anisotropic layer having the liquid crystal cured layer, the tacky layer, and the phase difference film; the tacky layer; the glass plate; the adhesive layer; the linear polarizer; and the liquid crystal cell as an image display element; in this order from the viewing side.

Each of the obtained image display devices was observed from the front direction of the display surface thereof. As the observation, both the observation without wearing polarized sunglasses and the observation with wearing polarized sunglasses were performed. Then, the color tone of the observed image, fluctuation of the color tone, the luminance, and fluctuation of the luminance were evaluated.

As a result, in either case where the polarized sunglasses were worn or not, there were almost no differences between the image display device (liquid crystal display device) produced using the sample before exposed to the xenon lamp and the image display device (liquid crystal display device) produced using the sample after exposed to the xenon lamp in the color tone, the fluctuation of the color tone, the luminance, and the fluctuation of the luminance.

Example 8

Two commercially-available organic EL display devices (smartphones "G FlexLGL23" manufactured by LG electronics) were prepared, each of which had a circular polarizing plate on its display surface. The circular polarizing plate of each of the organic EL display devices was removed, and instead thereof each of the circular polarizing plates produced in the process in Example 7 (Production of circular polarizing plate) was attached so that the polarizing film of the circular polarizing plate faced the viewing side. The luminance of the obtained organic EL display devices in a state of displaying a black image and the luminance of the obtained organic EL display devices in a state of displaying a white image were measured. The luminance of the organic EL display device, produced using the sample before exposed to the xenon lamp, in a state of displaying a black image was 6.2 cd/m$^2$, and that in a state of displaying a white image was 305 cd/m$^2$. The luminance of the organic EL display device, produced using the sample after exposed to the xenon lamp, in a state of displaying a black image was 6.4 cd/m$^2$, and that in a state of displaying a white state was 310 cd/m$^2$.

The display surface of each of the organic EL display devices in a state of displaying a black state was visually observed from the front direction of the display surface under outside light in a fine day. As a result, there was no outside light reflection on the display surface of each of the organic EL display devices, and the display surface of each of the organic EL display devices was in a black color. Further, the display surface was visually observed from a tilt direction (polar angle: 45°, all azimuth directions), and as a result, there was no difference between the organic EL display devices in variation of reflectance and color tone measured depending on the azimuth angles.

Comparative Example 4

Liquid crystal display devices were obtained by the same operation as that of Example 7 except that the optical layered body produced in Comparative Example 1 was used instead of the optical layered body produced in Example 4.

Each of the obtained image display devices was observed from the front direction of the display surface thereof. As the observation, both the observation without wearing polarized sunglasses and the observation with wearing polarized sunglasses were performed. Then, the color tone of the observed image, fluctuation of the color tone, the luminance, and fluctuation of the luminance were evaluated.

As a result, in either case where the polarized sunglasses were worn or not, there were clear differences between the liquid crystal display device produced using the sample before exposed to the xenon lamp and the liquid crystal display device produced using the sample after exposed to the xenon lamp in the color tone, the fluctuation of the color tone, the luminance, and the fluctuation of the luminance. Further, the display performance of the liquid crystal display device produced using the sample after exposed to the xenon lamp was inferior to that of the liquid crystal display device produced using the sample before exposed to the xenon lamp.

Example 9: Production of Optical Layered Body Including Electroconductive Layer

A film forming machine was prepared which was capable of forming an electroconductive layer by sputtering on the substrate layer-side surface of the optical layered body produced in Example 1. The film forming machine is a film winding-type magnetron sputtering machine capable of forming a desired electroconductive layer on the substrate layer-side surface of the optical layered body fixed on a long-length carrier film continuously conveyed in this machine. As the carrier film, a polyethylene terephthalate film was used.

The optical layered body was fixed to the carrier film with a polyimide tape. Then, the carrier film was supplied to the film forming machine, and an electroconductive layer was formed on one surface, which is the substrate layer-side surface, of the optical layered body. At this time, an $In_2O_3$—$SnO_2$ ceramic target was used as the target for sputtering. The film formation was performed under conditions of an argon (Ar) flow rate of 150 sccm, an oxygen ($O_2$) flow rate of 10 sccm, an output power of 4.0 kW, a degree of vacuum of 0.3 Pa, and a film conveyance speed of 0.5 m/min.

As a result, a transparent electroconductive layer formed of ITO and having a thickness of 100 nm was formed on the substrate layer-side surface of the optical layered body. In this manner, an optical layered body having an electroconductive layer was obtained. The curl amount of the layered body was measured. As a result, the curl amount was 5 mm.

Example 10

An electroconductive layer was formed and the curl amount was measured by the same operation as that of Example 9 except that the optical layered body produced in Example 4 was used instead of the optical layered body produced in Example 1. As a result, the curl amount was 3 mm.

REFERENCE SIGN LIST

10 optical layered body
20 liquid crystal display device
30 organic EL display device
100 substrate layer
110 first outer layer
120 second outer layer
130 intermediate layer
200 optically anisotropic layer
210 liquid crystal cured layer
310 light source
320 light source-side linear polarizer
330 liquid crystal cell
340 circular polarizing plate
350 linear polarizer
360 electroconductive layer
370 optical layered body
410 organic EL element
420 circular polarizing plate
430 electroconductive layer
440 optical layered body
450 linear polarizer

The invention claimed is:

1. An optical layered body comprising a substrate layer, and an optically anisotropic layer containing at least one liquid crystal cured layer, wherein
a light transmittance of the substrate layer at a wavelength of 390 nm is 1% or less, and
an in-plane retardation Re0(450) at a wavelength 450 nm before the optical layered body is exposed to the xenon lamp, an in-plane retardation Re0(550) at a wavelength 550 nm before the optical layered body is exposed to the xenon lamp, an in-plane retardation Re300(450) at the wavelength 450 nm after the optical layered body was exposed to the xenon lamp for 300 hours, and an in-plane retardation Re300(550) at the wavelength 550 nm after the optical layered body was exposed to the xenon lamp for 300 hours satisfy the following formulae (1) and (2):

$$0.95 \leq Re300(450)/Re0(450) \leq 1.05 \quad (1),$$

$$0.95 \leq Re300(550)/Re0(550) \leq 1.05 \quad (2).$$

2. The optical layered body according to claim 1, wherein an in-plane retardation Re0(650) at a wavelength of 650 nm before the optical layered body is exposed to the xenon lamp and an in-plane retardation Re300(650) at the wavelength of 650 nm after the optical layered body was exposed to the xenon lamp for 300 hours satisfy the following formula (3):

$$0.95 \leq Re300(650)/Re0(650) \leq 1.05 \quad (3).$$

3. The optical layered body according to claim 1, wherein an in-plane retardation of the substrate layer is 5 nm or less, and
a thickness-direction retardation of the substrate layer is 15 nm or less.

4. The optical layered body according to claim 1, wherein the substrate layer includes a first outer layer, an intermediate layer containing an ultraviolet absorber, and a second outer layer in this order.

5. The optical layered body according to claim 1, comprising an electroconductive layer.

6. The optical layered body according to claim 1, wherein the optically anisotropic layer functions as a λ/4 plate.

7. The optical layered body according to claim 1, wherein the optically anisotropic layer functions as a λ/2 plate.

8. The optical layered body according to claim 1, wherein the optically anisotropic layer includes the liquid crystal cured layer functioning as one of a λ/4 plate and a λ/2 plate, and a layer functioning as the other of the λ/4 plate and the λ/2 plate, and functions as a broadband λ/4 plate.

9. The optical layered body according to claim 1, wherein a light transmittance of the liquid crystal cured layer at a wavelength of 390 nm is 70% or more.

10. A circular polarizing plate comprising the optical layered body according to claim 1, and a linear polarizer.

11. A touch panel comprising the circular polarizing plate according to claim 10.

12. An image display device comprising an image display element, and the circular polarizing plate according to claim 10 provided on a viewing side of the image display element.

13. The image display device according to claim 12, wherein the image display element is a liquid crystal cell or an organic electroluminescent element.

* * * * *